United States Patent
Holcombe et al.

(10) Patent No.: US 7,486,386 B1
(45) Date of Patent: Feb. 3, 2009

(54) OPTICAL REFLECTANCE PROXIMITY SENSOR

(75) Inventors: Wayne Thomas Holcombe, Mountain View, CA (US); Miroslav Svajda, Sunnyvale, CA (US)

(73) Assignee: Silison Laboratories Inc., Austin, TX (US)

( * ) Notice: Subject to any disclaimer, the term of this patent is extended or adjusted under 35 U.S.C. 154(b) by 33 days.

(21) Appl. No.: 11/859,403

(22) Filed: Sep. 21, 2007

(51) Int. Cl.
*G01C 3/08* (2006.01)

(52) U.S. Cl. ............... 356/4.01; 356/4.1; 356/5.01; 356/5.1

(58) Field of Classification Search ........ 356/3.01–28.5
See application file for complete search history.

(56) References Cited

U.S. PATENT DOCUMENTS

| | | | |
|---|---|---|---|
| 3,621,268 A | 11/1971 | Friedrich et al. | |
| 3,716,833 A | 2/1973 | Roth | |
| 3,859,647 A | 1/1975 | Ross | |
| 3,937,952 A | 2/1976 | Ripley et al. | |
| 4,068,222 A | 1/1978 | Treviranus | |
| 4,207,466 A | 6/1980 | Drage et al. | |
| 4,306,147 A | 12/1981 | Fukuyama et al. | |
| 4,479,053 A | 10/1984 | Johnston | |
| 4,659,922 A | 4/1987 | Duncan | |
| 4,701,610 A | 10/1987 | Hoogenboom | |
| 4,723,073 A * | 2/1988 | Amikura et al. | 250/201.4 |
| 4,855,590 A | 8/1989 | Bures et al. | |
| 4,896,606 A | 1/1990 | De Coi | |
| 5,025,516 A | 6/1991 | Wilson | |
| 5,103,085 A | 4/1992 | Zimmerman | |
| 5,428,439 A * | 6/1995 | Parker et al. | 356/5.01 |
| 5,486,690 A * | 1/1996 | Ake | 250/206.1 |
| 5,585,626 A | 12/1996 | Beck et al. | |
| 5,672,863 A | 9/1997 | Nicks et al. | |
| 5,707,160 A | 1/1998 | Bowen | |
| 5,760,390 A | 6/1998 | Vezzalini et al. | |
| 5,837,997 A | 11/1998 | Beck et al. | |
| 5,864,591 A | 1/1999 | Holcombe | |
| 5,991,040 A | 11/1999 | Doemens et al. | |
| 6,107,938 A | 8/2000 | Du et al. | |
| 6,218,967 B1 | 4/2001 | Maula | |

(Continued)

FOREIGN PATENT DOCUMENTS

WO    WO97/14344    4/1997

OTHER PUBLICATIONS

Panasonic; "Panasonic Ideas For Life" General Catalogue, Mar. 2005, 51 pgs.

(Continued)

*Primary Examiner*—Thomas H Tarcza
*Assistant Examiner*—Luke D Ratcliffe
(74) *Attorney, Agent, or Firm*—O'Keefe, Egan, Peterman & Enders LLP

(57) ABSTRACT

A method for calibrating an optical reflectance proximity sensor and then measuring proximity in a repeating cycle or on demand, the sensor including one or more wavelength transmitting diodes, one or more wavelength receiving diodes, an ambient correction circuit, and a comparator circuit, and further teaching steps for powering on the sensor, canceling the ambient signal during a calibration period, transmitting wavelengths to and receiving reflectance from an object in the path of the transmitted wavelengths, and measuring a reflectance pulse width and comparing the value to a preset value to determine proximity.

23 Claims, 21 Drawing Sheets

U.S. PATENT DOCUMENTS

| | | |
|---|---|---|
| 6,240,283 B1 | 5/2001 | Holcombe |
| 6,828,546 B2 | 12/2004 | Reime |
| 6,965,327 B2 | 11/2005 | Reime |
| 2005/0118975 A1* | 6/2005 | Ismail ................. 455/283 |
| 2006/0161871 A1 | 7/2006 | Hotelling et al. |
| 2008/0036743 A1 | 2/2008 | Westerman et al. |

OTHER PUBLICATIONS

Bonen et al., "A Novel Electro-Optical Proximity Sensor For Robotics: Calibration And Active Sensing", IEEE Trans. On Robotics And Automation, vol. 13, No. 3, Jun. 1997, 23 pgs.

Avago Technologies, "General Application Guide For Proximity Sensor", Application Note 5281, Jun. 17, 2006, 23 pgs.

Avago Technologies, "HSDL-9100, Surface Mount Proximity Sensor", Data Sheet, Mar. 29, 2006, 12 pgs.

Solarbotics, "Proximity Sensors", Beam Pieces, Apr. 21, 2006, Printed From Internet Oct. 30, 2008, 3 pgs.

Techno-Stuff.com, "Dual IR Proximity Detector", DIRPD-T, May 6, 2006, Printed From Internet Oct. 30, 2008, 4 pgs.

Banner Engineering, Corp., "Lesson 4C, Sensing In The Diffuse And Divergent Proximity Modes", Jan. 10, 2004, Printed from Internet Oct. 30, 2008, 3 pgs.

* cited by examiner

OPTICAL REFLECTANCE PROXIMITY SENSOR

CROSS-REFERENCE TO RELATED APPLICATIONS

The present invention is related in part to a U.S. Pat. No. 5,864,591 entitled "Apparatus and Method for Suppression of Feedback in a Communications Receiver" issued on Jan. 26, 1999 to Wayne T. Holcombe, and in part to a U.S. Pat. No. 6,240,283 entitled "Apparatus and Method for Suppression of Feedback in a Communications Receiver", issued on May 29, 2001; both disclosures included herein at least by reference.

BACKGROUND OF THE INVENTION

1. Field of the Invention

The present invention is in the field of electronic sensors and pertains particularly to an improved reflectance sensor usable in various commercial and consumer applications.

2. Discussion of the State of the Art

In the field of sensory devices, more particularly electronic sensors, proximity sensing and motion detection are regimens that provide contact-less control and object detection useful in a large variety of consumer, industrial, and security applications.

Development of various electronic technologies for proximity sensing has occurred and development continues. Each accepted technology has provided one or more advantages depending on the specific application of those technologies. These techniques can be classified in terms of the operating principle of the device versus the detection medium used, whether light, radio waves, or the like.

To provide one example, a well-known proximity sensor based on measuring an echo transit time that uses radio waves as a medium is called a radar. Another echo-principled proximity sensor that uses sound as a medium is called a sonar sensor. Still, another echo-principled proximity sensor that uses light as a medium is called a light-imaging detection and ranging (LIDAR) sensor. Although these classic echo-based sensors provide relatively accurate distance and speed information, they can, depending on the application, be expensive, bulky, may consume high power, and/or may require very high frequency technologies to be successful.

In contrast to the sensor device types described above, there are less expensive and much smaller proximity sensors that use field disturbance techniques to detect proximity. These sensors may be classed as either passive or active sensors. These types of sensors detect proximity base on changes in a field caused by interactions with a detected object.

Of the above-described sensors, passive field-disturbance detectors use background radiation or the emissions of an object as the source of the field. To exemplify, a sound-activated switch may be provided in a "smart toy" to sense when a human is talking nearby. In another case of what would be termed a passive sensor, an infrared motion detector may sense changes in the infrared background due to movement of objects irradiating infrared above the background because of their higher temperature. Such passive infrared sensors are widely used in high-volume applications for alarm systems, automatic light turn-on sensors, and the like.

An active proximity sensor may detect changes in field disturbances caused by an active source. One example of such an active sensor may be a magnetic field-disturbance proximity sensor (metal detector) that senses changes in a local alternating current (AC) magnetic field due to eddy current or magnetic characteristics of metal objects. Another well-known example is that of a "stud finder" used in carpentry. A stud finder is an AC electrostatic field disturbance sensor that senses the change in dielectric constants between air and wood as the finder is slid across overlying plaster.

Still another example of an active field disturbance detector is a proximity sensor that detects changes in optical reflectance, avoiding technical difficulties of nanosecond time resolution necessary for RF or optical echo transit time devices. Optical reflectance proximity sensors have certain key advantages over other types of proximity sensors for sensing objects in the range of 1 to 100 centimeters (cm). The advantage may be due to the fact that they typically use a small LED as a light source and a small photodiode driving a receiver circuit. Another advantage is that they can be small enough to fit in miniature electronic devices. Even these types of active reflectance sensors, although fairly small and robust, have been too expensive for consumer applications and consequently have found applications mostly in the industrial and commercial markets.

Passive infrared sensors are the most common in consumer application due to lower cost. However, they are too large for many consumer products because they require a collecting lens and a photodiode of several centimeters in diameter to gather a sufficient signal to sense changes in the ambient background visible to the sensor. Moreover, a major handicap of such sensors is a lack of reliability earmarked by spurious triggering and by failure to trigger. For example, large, far-away objects or sudden temperature changes may trigger them and they can completely miss radiation-neutral objects.

Reflectance sensors have been developed that overcome the handicaps described immediately above even though they do not inherently measure distance (as echo transit-time devices do). Reflectance sensors can detect an object moving into certain ranges unambiguously because of a strong fourth-power decrease of reflected light from the object sensed. A 20% change in distance will cause approximately a 100% change in reflected signal. For objects with a 10-to-1 variation in reflectance between them, this amounts to less than 50% difference in detection range.

Small, short range (1 cm to 2 m) reflectance proximity sensors are more useful than passive infrared sensors in many applications. However, widespread use in consumer applications is not apparent because of higher cost factors.

In general, proximity-sensor applications break down into two broad functional groups: (1) those that provide an on-off function and (2) those that provide analog or digital proportional information. Examples in the first category include: automatic flushing for a public lavatory; an automatic doorbell that detects a person passing through a door; or an object sensor on an automatic production line. Examples in the second category are: an automobile bumper warning indicator that puts out an audible warning signal whose pitch is proportional to the distance from an obstacle; a toy car that slows down when it approaches an object and steers away from it; or a light switch that can be activated and dimmed by waving one's hand near it.

Proximity sensors that provide on-off functions can often serve as replacement for switches that are either operated manually or by some other machine function. In both cases, the electronic proximity switch will be more reliable than a standard mechanical switch especially if a very high number of cycles occur over the life of the switch. But since most proximity sensors require significant amounts of power, they are not normally used for power switches on battery-powered products. Of course, like normally open or normally closed switches, a proximity sensor can provide either an "on" or "off" function when an object moves in or out of proximity.

Further to the above, some proximity-sensor applications also need to measure the ambient background light such as a proximity-activated security light. Proximity sensors that provide analog proportional information can functionally replace analog controls allowing smarter processing of proximity information for more complex applications. However, unlike on-off proximity sensors, proportional sensors generally need to interface to a microprocessor.

The inventors are aware of a method taught by Holcombe (U.S. Pat. No. 5,864,591) for using circuitry to reduce feedback in an infrared data receiver. The method includes a circuit that is configured as an infrared receiver including an automatic gain control (AGC) circuit where the AGC is isolated from the input to the receiver in response to the output signal from the receiver in order to suppress the effect of feedback from the output signal to the input of the receiver.

The inventors are also aware of an enhancement to the method taught by Holcombe (U.S. Pat. No. 6,240,283). The enhancement includes a method and apparatus for controlling the input gain of a receiver whereby the input gain is controlled by sampling an amplified data signal during a time interval when a positive-going feedback transient from an output terminal of the receiver to an input terminal of the receiver is not present in the amplified data signal.

In this enhanced circuit, an input amplifier has variable gain determined by a gain control signal, a comparator which compares the amplified data signal from the input amplifier to a detection threshold voltage to produce a demodulated data signal and an analog delay circuit which delays the amplified data signal by a predetermined time interval to produce a delayed data signal. The method is enabled by a switch that is driven by the demodulated data signal to sample the delayed data signal for input to an automatic gain control circuit. The automatic gain control circuit compares the sampled delayed data signal to an automatic gain control threshold potential and rectifies and integrates the resulting waveform to produce the gain control signal.

In one application, the data signal is amplified by a gain factor and the signal is then compared to a detection threshold voltage to produce a demodulated data signal. The amplified signal is also delayed to produce a delayed data signal. The delayed signal is sampled using the demodulated data signal to produce a sampled data signal that is used to adjust the gain factor in the amplifier. Although the technique described by Holcombe may provide some feedback immunity from a detected infrared receiver output to a photodiode in a IRDA communications receiver, there may also be significant feedback from the LED driver to the photodiode. For example, the LED driver produces both a voltage and an inductive current transient when it initially turns on. The voltage transient can couple to the photodiode input via wire-bond and PCB-trace capacitances. The inductive transients can couple to the photodiode input through ground and power-supply traces. These transients (voltage and inductive) may produce spurious signals that mask low-level reflectance signals, thus limiting the minimum detectable signal levels in the communications receiver circuit.

It has occurred to the inventor that with some innovative enhancement to the feedback immunity techniques described in U.S. Pat. No. 5,864,591, and in U.S. Pat. No. 6,240,283, a low cost optical reflectance proximity sensor could be provided that could overcome the problems associated with the relevant art described above.

Therefore, what is clearly needed in the art is a reliable and sensitive optical reflectance proximity sensor that is very small and inexpensive to manufacture. Such a sensor would consume very little power, would not be required in all applications to interface with a microprocessor, and could be implemented in some analog output applications without the complexity and cost of using a standard digital-to-analog (DAC) converter.

SUMMARY OF THE INVENTION

A proximity sensor is provided. The sensor includes one or more wavelength transmitting diodes, one or more wavelength receiving diodes, an ambient correction circuit for canceling ambient noise in a signal generated at the one or more receiving diodes, and a comparator circuit for comparing a received signal against a preset threshold value to detect proximity.

In one embodiment, at least one of the one or more transmitting diodes is a visible-light emitting diode and at least one of the one or more receiving diodes is a photodiode. In another embodiment, at least one of the one or more transmitting diodes is an infrared light emitting diode and at least one or more of the receiving diodes is an infrared receiver.

In one embodiment, there are more than one transmitting diode and more than one receiving diode, the transmitting diodes including an infrared transmitting diode and a visible light emitting diode and the receiving diodes including a photodiode for receiving reflected light and an infrared receiver for receiving reflected infrared light.

In one embodiment, the sensor further includes a noise peak detector for establishing a peak value above transient ambient spikes. In a variation of this embodiment at least one of the one or more transmitting diodes is a visible-light emitting diode and at least one of the one or more receiving diodes is a photodiode.

In another embodiment, the sensor further includes an adjustable delay clock, and a data latching circuit. In this embodiment, a clock signal is input into the data latching circuit to latch the output of the comparator circuit, the delay clock advanced or retarded to adjust proximity detection sensitivity. In a variation of this aspect, at least one of the one or more transmitting diodes is a visible-light emitting diode and at least one of the one or more receiving diodes is a photodiode.

In all aspects of the sensor, the output pulse width of the comparator circuit is proportional to the DC ambient background signal level. In a variation of this aspect the output pulse width of the comparator is converted to a digital value by a counter driven by a frequency source.

In one embodiment, there are more than one transmitting diode, and a single receiving diode, the transmitting diodes geometrically arraigned about the receiving diode at different distances from the receiving diode. In a variation of this embodiment, the transmitting diodes reflectance contribution levels are compared to determine proximity according to a mathematical formula. In a variation of this aspect, comparison of each transmitting diodes reflectance contribution determines direction of motion of an object moving in the sensor field.

According to another aspect of the present invention, a method for calibrating a proximity sensor and then measuring proximity is provided, the sensor including one or more wavelength transmitting diodes, one or more wavelength receiving diodes, an ambient correction circuit, and a comparator circuit. The method includes steps for (a) powering on the sensor, (b) canceling the ambient signal during a calibration period (c) transmitting wavelengths to and receiving reflectance from an object in the path of the transmitted wavelengths, and (d) measuring a reflectance pulse width and comparing the value to a preset value to determine proximity.

In one aspect of the method in step (a), power up is performed in response to an internal or external event. In one aspect, the sensor further includes a peak detector for establishing a peak value above transient ambient spikes. In a further aspect, the sensor includes an adjustable delay clock, and a data latching circuit.

In another aspect of the method, there are more than one transmitting diode and in step (c), each of the transmitting diodes is caused to transmit separately from the other diodes. In one aspect of the method, in step (d), the proximity determination controls an on/off switch. In another aspect, in step (d), the proximity determination is analyzed to provide additional information about direction and or speed of movement of an object sensed.

BRIEF DESCRIPTION OF THE DRAWING FIGURES

DETAILED DESCRIPTION

The inventors provide an improved active optical reflectance proximity sensor architecture that may include a first-order, wide-loop DC ambient correction circuit that along with an optional feedback-immunity circuit among other added functions to achieve very high reflectance sensitivity in the presence of large DC and other ambient noises. The sensor is enabled using an economically viable architecture allowing for sensor implementation in the form of very low power on-off proximity sensors and more sophisticated analog-output proximity sensors that can be easily interfaced to microprocessors, or may stand alone, in some applications, to facilitate a wide range of proximity applications. The invention is described in detail in the various embodiments presented herein.

Figure 1:
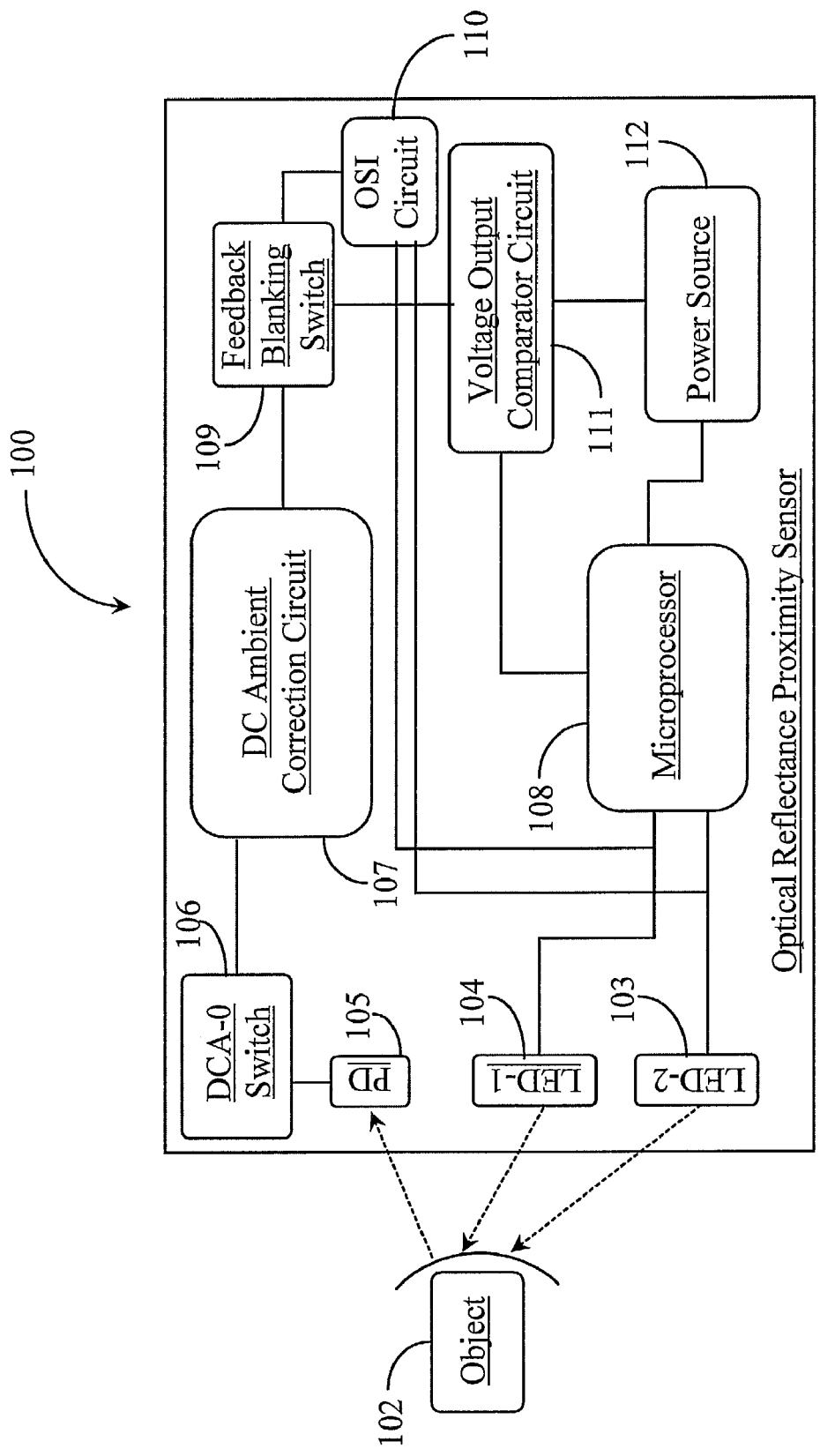
FIG. 1 is a block diagram of an optical reflectance proximity sensor according to an embodiment of the present invention.

FIG. 1 is a block diagram of an optical reflectance proximity sensor 100 according to an embodiment of the present invention. Proximity sensor 100 is configured as an "active" optical reflectance proximity sensor (OPRS) device that can sense proximity by measuring a reflectance signal received at a photodiode (PD) 105 from an object 102 residing in or moving through the detection corridor or calibrated detection space of the module. Very basically, sensor 100 works by emitting light through one or more light emitting diodes (LEDs) like LED-1 (104) and LED-2 (103) implemented in this example. The light emitted from LEDs 103 and 104, in this example, is directed generally toward an area where object 102 may cause detection by its introduction into and/or movement through the object detection corridor or "visible" area of the sensor. Reflected light from object 102 and ambient light from background or other noise sources is received at PD 105 provided as part of the sensor and adapted for the purpose. Sensor 100 is enhanced with circuitry to reliably determine the amount of reflectance received from object 102 over noise and other ambient signals to a high degree of sensitivity and reliability.

There may be one or more LEDs such as LEDs 103 and 104 installed in proximity sensor 100 without departing from the spirit and scope of the present invention. The inventors show two LEDs and deem the illustration sufficient for the purpose of explaining the invention. In one embodiment there may be more than two LEDs chained in parallel, multiplexed, or independently wired. LEDs 103 and 104 in this example may be very small compact devices capable of emitting continuous light (always on) or they may be configured to emit light under modulation control. Likewise, they may be powered off during a sleep mode between proximity measurement cycles. The actual light emitted from the LEDs may be visible or not visible to the human eye such as red light and/or infrared light. In one embodiment, at least one visible-light LED may be provided for optical reflectance measuring.

In this logical block diagram, the exact placement of components and the trace connections between components of sensor 100 are meant to be logical only and do not reflect any specific designed trace configuration. In a preferred embodiment, LEDs 103 and 104 are strategically located in proximity to PD 105 so that light (illustrated by broken directional arrows) reflects off of object 102 and is efficiently received by PD 105 as reflectance.

ORPS 100 includes a DC ambient correction circuit 107, which may be referred to hereinafter as DCACC 107. DCACC 107 is a first order, wide loop correction circuit that has connection to a DC ambient zero (DCA-0) switch 106 that is connected inline to PD 105 through a gate such as a PMOS gate described later in this specification. Sensor 100 may therefore be first calibrated where the DC ambient light coming from any sources other than optical reflectance is measured and then cancelled to determine the presence of any reflectance signal that may qualified against a pre-set threshold value that may, in one example, be determined during calibration of sensor 100.

Reflectance is determined, in a preferred embodiment of the present invention by measuring the amplified pulse width of an output voltage signal. Correction for DC ambient light is accomplished by enhancing sensor 100 with the capability of producing an amplified pulse width that is proportional to the measured DC ambient light entering PD 105. DCACC 107 and switch 106 are provided and adapted for that purpose along with a voltage output comparator circuit 111. More particularly during calibration for DC ambient light, correction is accomplished by setting the DC-ambient correction to zero using switch 106 at the beginning of the calibration cycle and then measuring the width of the detected pulse during the calibration cycle. The width of the output pulse is proportional to the background DC ambient. Of course, during calibration the transmitter LED or LEDs are disabled.

ORPS 100 includes a power source 112 and a microprocessor 108. In this example, microprocessor 108 is logically illustrated as onboard sensor 100. This is not required in order to practice the present invention. Microprocessor 108 may be part of an interfacing piece of equipment depending on the application. Power source 112 may be a battery power source, a re-chargeable source or some other current source. In this example, the transmitter LEDs 103 and 104 are connected to and are controlled by microprocessor 108 and may receive power through microprocessor 108 as well. PD 105 also has a connection to power source 112. In one embodiment there may be more than one power source used to operate sensor 100 without departing from the spirit and scope of the present invention. Power source 112 and microprocessor 108 are illustrated logically in this example only to show that the sensor derives power from a power source and that optionally, micro processing may be used to control certain sensor functions.

DC ambient circuit 107 produces a voltage from its input signal received from PD 105. ORPS 100 includes voltage output comparator circuit (VOCC) 111 that accepts an input voltage signal and, in this example, makes the proximity decision based on measuring pulse width and comparing the measured pulse width against a threshold value to determine proximity. If the pulse width measured meets or exceeds the threshold value then the sensor registers detection of object 102. Input to VOCC 111 from circuit 107 is routed through a feedback-blanking switch (FBS) 109 provided inline between DCACC 107 and VOCC 111. FBS 109 is driven by a one-shot circuit (OSI) 110, which provides the blanking pulse to the switch when LEDs 103 and 104 are enabled and transmitting.

FBS 109 and OSI 110 in combination provide an additional sensitivity enhancement for proximity sensing by further reducing noise in the circuit by up to 30 decibels (dB), therefore increasing overall proximity detection sensitivity by that amount. In operation of ORPS 100, calibration is first performed to measure the average DC ambient light conditions using DCACC 107 and VOCC 111 with LED 103 and LED 104 switched off. When the DC ambient loop has settled and a valid threshold has been determined, LEDs 103 and 104 are switched on for proximity detection. Reflectance received at PD 105 from object 102, in this example, produces a voltage above DC ambient. When the input voltage reaches VOCC 111, if it is above the threshold the resulting voltage output (RO) to microprocessor 108 changes indicating detection of object 102, in this case.

In one embodiment, optical isolation is provided, such as by a partition, to isolate PD 105 from receiving any cross talk from LEDs 103 and 104. One or more optical windows may be provided in the casing of sensor 100 to enable the desired light reflectance path from LED to PD. ORPS 100 may be provided in high volume as a very low cost and robust reflectance sensor for use in many different consumer applications. For example, ORPS 100 may be configured as a battery-powered on-off proximity sensor where combined with an RF transmitter, could be used as an automatic wireless alert system that sends an RF signal to a remote receiver and alerting system whenever there is change in proximity for applications such as a wireless automatic doorbell or a wireless security alarm sensor. Users can easily install these devices on entryways or hallways without the need to run wires or making mechanical connections. Other conceivable applications for the low cost low power sensor might include such as automotive backup indicators, light-switch triggers, toys that sense proximity, computer-monitor activation, cell-phone speaker-mode switches, and so on. There are many possible applications.

Figure 2:
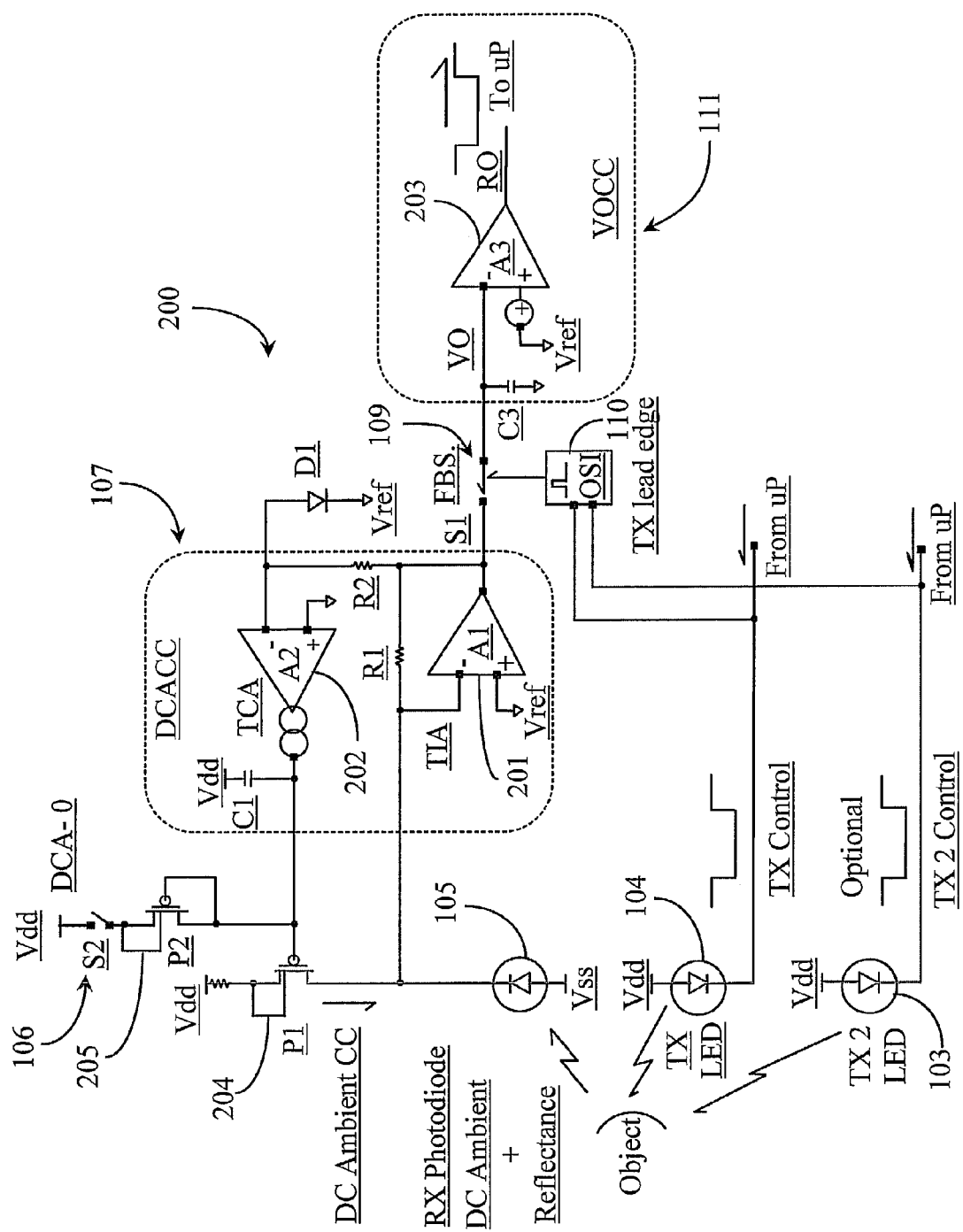
FIG. 2 is a circuitry diagram of the sensor of FIG. 1.

FIG. 2 is a circuitry diagram illustrating circuitry 200 of sensor 100 of FIG. 1. Circuitry 200 may be implemented in a complimentary metal oxide semiconductor (CMOS) semiconductor process. Other circuitry logics may also be used to implement the appropriate functionality. The microprocessor can be external or built-in on the same chip substrate. Photodiode 105 can be external or also implemented on the same chip. Led1 104 and Led2 103 are external.

Circuitry 200 includes DCACC 107 and VOCC 111. VOCC 111 may also be referred to as a receive/detect circuit in this example. The circuitry making up DCACC 107 is illustrated as enclosed by a broken perimeter labeled 107. DCACC 107 includes a trans-impedance amplifier (TIA) A1 (201), a transconductance amplifier (TCA) A2 (202), resistors R1 and R2, and a charge capacitor (C1). These components represent a low-cost and efficient implementation of DCACC 107.

DCA-0 switch (S2) 106 is illustrated as connected to a first PMOS gate (P2), which is in turn connected to a PMOS gate (P1). Gate P1 is connected inline with the output terminal of amplifier A2 (202). A2 receives its input from trans impedance amplifierA1 (201). For purposes of simplification in description, amplifier A2 will be referenced as TCA 202 and amplifier A1 will be referenced as TIA 201. TCA 202 removes DC and low frequency signals. It is important to note that for proximity sensing, TCA 202 takes its error input from the amplifier chain, more particularly from TIA 201. In this respect, TIA includes amplifier A1 and resistor R1.

A microprocessor (uP) is not illustrated in this example but is assumed to be present as an on board or as an off board component. Transmitting (TX) LED 104 is illustrated in proximity to PD 105 as was illustrated in FIG. 1. TX LED 103 is optional in this embodiment and not required to practice the present invention, however, there may be more than two TX LEDs provided without departing from the spirit and scope of the present invention. In this example, TX control is provided by a connected microprocessor (uP) as indicated by respective TX control lines.

VOCC 111 includes amplifier A3 (203) and charge capacitor C3. When detecting proximity, PD 105 receives reflected light from LED 104 and from LED 103 illustrated as a reflectance arrow emanating from object 102 and entering PD 105. The resulting current proceeds to TIA 201 formed by operational amplifier A1 and feedback resistor R1. Amplified output from TIA 201 proceeds through FBS 109 (S1) as signal VO (voltage out) to VOCC 111, particularly to amplifier 203 (A3). If VO is above the proximity detection threshold relative to pulse width the RO (resulting output) of VOCC 111 changes. If VO is below the threshold then RO does not change.

Output from TIA 201 also proceeds through R2 to the input of DCACC 202 (A2). Here the input is limited by a diode (D1) or an equivalent limiting circuit. In this way, the output of TCA 202 (A2) has a fixed maximum current to charge C1. This state causes the current proceeding through PMOS 204 (P1) to ramp at a maximum linear rate. At such time when the current through PMOS 201 (P1) equals the current produced by PD 105, the input error of TIA 201 goes to zero. This state causes the output of TIA to fall thereby reducing the error input to TCA 202 (A2). This slows and then prevents further charging of C1. DCACC 107 can only slew at a fixed rate for large signals and at a proportionally smaller rate for signals below the clipping level, the time it takes for DCACC 107 to correct the input signal change is a measure of the amplitude of the input signal change. The duration of the output pulse RO at VOCC 111 is proportional to the total change of optical signal coupled into the photodiode generated by the LED.

This input current conversion to output pulse width includes converting both DC ambient and reflection signals to RO pulse width changes. DCA-0 switch 106 (S2) is closed during calibration and measurement of DC ambient light. Closing switch S2 causes the current through PMOS 204 (P1) to fall near zero while still maintaining voltage on C1 very close to the gate threshold of P1. A period of time is allowed for the DC ambient correction loop to settle. DAC-0 106 (S2) is opened after the correction loop has settled re-enabling the DC-ambient correction loop. The voltage at C1 then increases until the current through PMOS 204 (P1) equals the DC ambient photocurrent resulting from PD 105. Therefore, the time it takes for RO to return to its normal state after changing due to proximity detection is proportional to the DC-ambient input current output by PD 105 with the LEDs switched off.

Conversely, for measuring reflectance, S2 is held open while sufficient time is allowed for DC ambient background calibration including letting the DC ambient loop settle or cancel the average DC background ambient. After calibration is complete, TX LEDs 103 and 104 are enabled to transmit light. The subsequent increase in photocurrent put out by PD 105 as the result of reflectance from object 102 is amplified by A1 causing a change in RO output from VOCC 111 only if the amplified change exceeds the proximity detection threshold. After detecting reflectance (sensing proximity) the DC-ambient loop causes the voltage on C1 to increase until it cancels the increase in photocurrent due to reflectance. At this point in the process, VO (the amplified signal output from TIA 201) returns to its normal value, thus ending the detection cycle and allowing RO (output from VOCC 111 to return to its previous value. The period of time between TX of the LEDs and when RO returns to its previous value is proportional to the magnitude of the reflectance signal.

One with skill in the art will recognize that within the sensor circuitry 200 presented in this example, DCACC 107 continuously operates to remove normal changes in the background ambient light. Only transient changes produce an output. Output only occurs when there is a difference between the DC correction signal and the input signal. An advantage of this method of reflectance measurement is that resolution is limited by the "shot noise" of PD 105, provided a low noise photo amplifier is used. Circuitry 200 exhibits the lowest noise for the DC ambient correction current source if a moderately large PMOS is used for P1 and an appropriate degeneration resistor is used at its Vdd source. The integrator capacitor on the gate of P1 removes most of the noise components of TCA 202.

In this embodiment, feedback blanking is implemented by switch 109 (S1), which is driven by one-shot circuit (OS1) 110. OSI110 produces a blanking pulse when the TX LED function is enabled. This blanking pulse is wider in this example than the settling time for transients within TIA 201 (A1). As discussed further above, introducing a blanking pulse into the process increases proximity detection sensitivity over 30 dB. Otherwise overall proximity sensitivity is reduced due to feedback noise from the leading edge of the transmitted pulse.

In one embodiment of the present invention, RO output from VOCC 111 proceeds to a digital counter in a microprocessor (uP) enabling a digital signal that can be processed for further information such as proximity data supporting analog alerts, beeps, escalating or reducing audible signals that may be appropriate to certain applications. One application might be a collision detector for a vehicle using low cost proximity sensors wherein repeated RO calculations past a threshold may be used to determine motion capturing the speed and proximity of an approaching object. ORPS 100 (FIG. 1) may be manufactured on a very small footprint enabling a wide variety of micro-sensor embodiments. The properties of static proximity, linearly mobile proximity, and directional proximity detection can be leveraged using the optical reflectance measurement process enhanced for high-sensitivity in detection by reducing or canceling DC ambient and other transient noise normally inherent to such a sensor.

Proximity motion sensors can be provided that may "understand" more than one type of executed motion as a particular command such as a lateral hand sweep moving across the sensor view or one that begins away from the field of view and progresses into the field. That kind of resolution in sensitivity has not been provided to current low power optical reflectance sensors. Using the sensor of the present invention, distances can be resolved more accurately. Other types of information may be deduced through high-level proximity measuring such as information about motion, direction, or about a characteristic of the sensed object such as color or reflectance properties relevant to the material makeup of the object.

Figure 3:
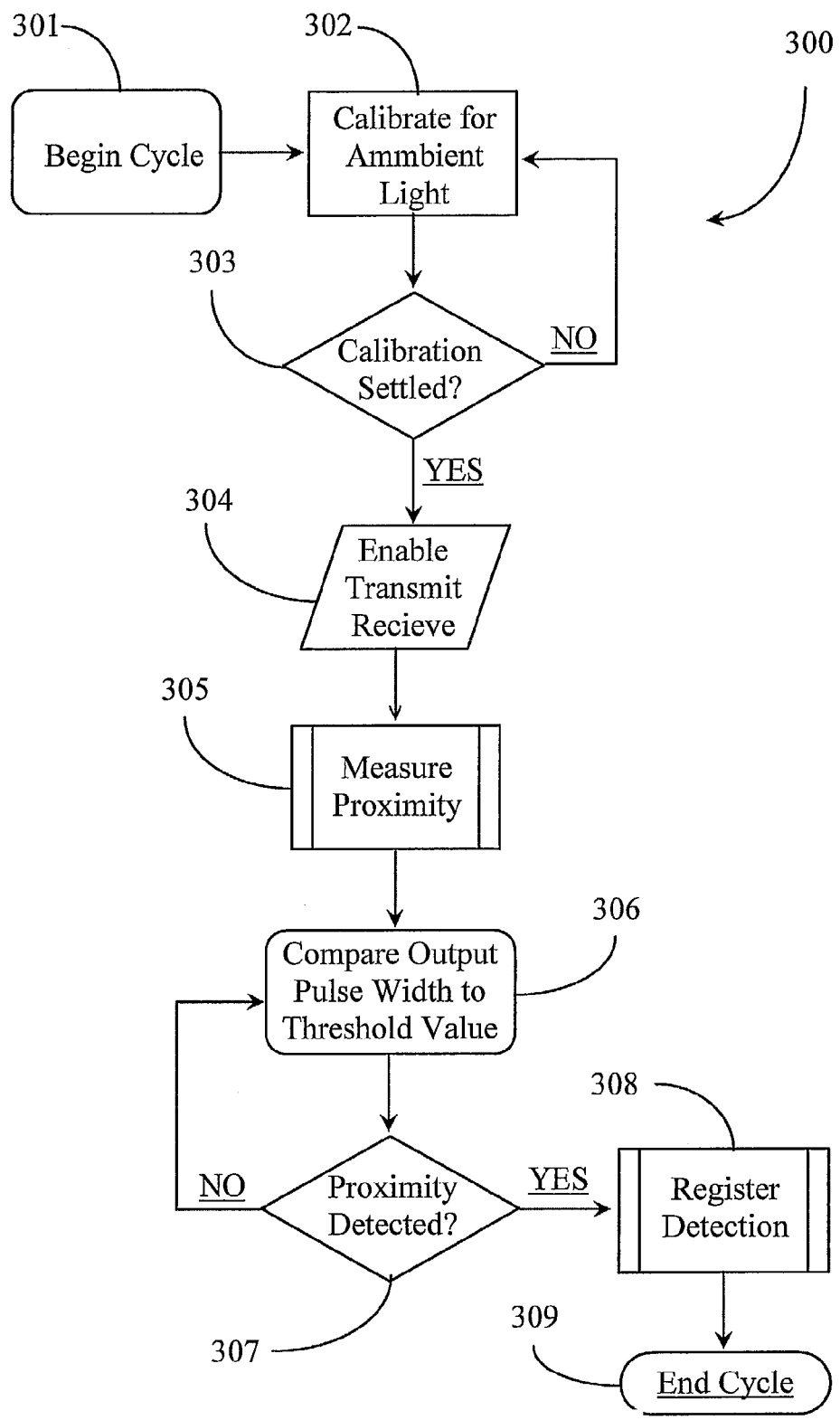
FIG. 3 is a process flow chart illustrating steps for sensing proximity using the sensor of FIG. 1 according to an embodiment of the present invention.

FIG. 3 is a process flow chart illustrating steps 300 for sensing proximity using the sensor of FIG. 1 according to an embodiment of the present invention. At step 301 the proximity sensor begins a cycle of activity. Such a cycle begins with a calibration process at step 302. The calibration step measures the ambient light detected at the photodiode such as at photodiode 105 of FIG. 1. At step 302 the LED TX is disabled so that no light is emitted from any LEDs during the calibration cycle.

At step 303 the system determines whether calibration is complete. In one embodiment step 303 is earmarked by the passage of a certain amount of time allotted for the DC ambient loop to settle and a DC measurement to be taken by a VOCC analogous to VOCC 111 of FIG. 1. In one embodiment, the average DC ambient pulse width measured during step 302 is referenced as a threshold value for later comparison.

At step 303 if it is determined that the calibration cycle is not complete, the process loops back to calibration at step 302. If the appropriate time has passed and it is determined that DC calibration is complete at step 303, then at step 304 TX functions of the LED or LEDs is enabled so the photodiode can detect any reflectance from an object.

At step 305, a proximity measurement cycle begins. At the beginning of this cycle, the input photocurrent is amplified and measured to determine if proximity can be deduced. The reflectance from the LED that is received by the photodiode causes an increase in the photocurrent above that of the background ambient photocurrent. In step 306, the VOCC compares the output pulse width to the threshold value (DC ambient threshold). If reflectance is present in the field of view of the sensor, the subsequent rise in signal current at the photodiode is amplified and then detected by the VOCC. The output pulse width of the VOCC is proportional to the reflected signal amplitude since the higher the reflectance, the longer the DC ambient detection circuit takes to cancel the reflectance signal.

At step 307, the measurement cycle is monitored to determine whether proximity will be detected. If in step 307, proximity is not detected, then the process loops back to step 306, which continues until proximity is detected in step 307. In one embodiment that will be described in more detail later in this specification, the calibration and proximity measurement cycles may alternate with a sleep cycle inserted in the process to save power. In this case, the sensor will wake up to begin a calibration cycle with LED TX disabled followed by a proximity detection cycle with LED TX enabled, followed by a sleep cycle of idle time before a next calibration cycle begins. After proximity is registered at step 308, the process may end at step 309 if the scope of the sensor is simply to provide on/off information based on a single detection event.

VOCC output (RO) changes when proximity is detected and in step 308, reactive to such a change in output voltage, proximity detection is registered by the sensor or by a component connected to the sensor such as a microprocessor. The event of proximity detection may, in some embodiments, lead to more tasks depending on the application of the sensor. For example, proximity detection may trigger an audible alarm, a door bell, an intrusion alert, a next task in an industrial process, a counter, and so on. In higher resolution embodiments proximity detection parameters may include differentiating between more than one transient proximity state. For example, a hand moving across the sensor in a particular direction may be equated with some command sent to a connected system whereas repeating the motion in the opposite direction may equate to a different command. Likewise, a reflectance signal that steadily rises and falls may indicate an object is approaching and then retreating from the sensor host or location. In these cases, the analog output may be economically converted to a digital input signal without using an analog to digital conversion module between the sensor and a microprocessor or controller.

In one embodiment, a method is provided to convert the reflectance or ambient pulse width to a digital value by using the output pulse width to gate a counter driven by a clock at a fixed frequency. One such embodiment is described later in this specification.

One with skill in the art of calibration and run cycling will appreciate that it is not specifically required to perform a calibration step before each proximity measurement step in order to successfully practice the present invention. For example, if DC ambient is fairly constant and not transient, calibration may be performed less frequently. However, in many applications DC ambient may be subject to sudden or more gradual intensity changes that can affect the sensitivity of the sensor and which may cause spurious proximity detection in some cases.

Figure 4:
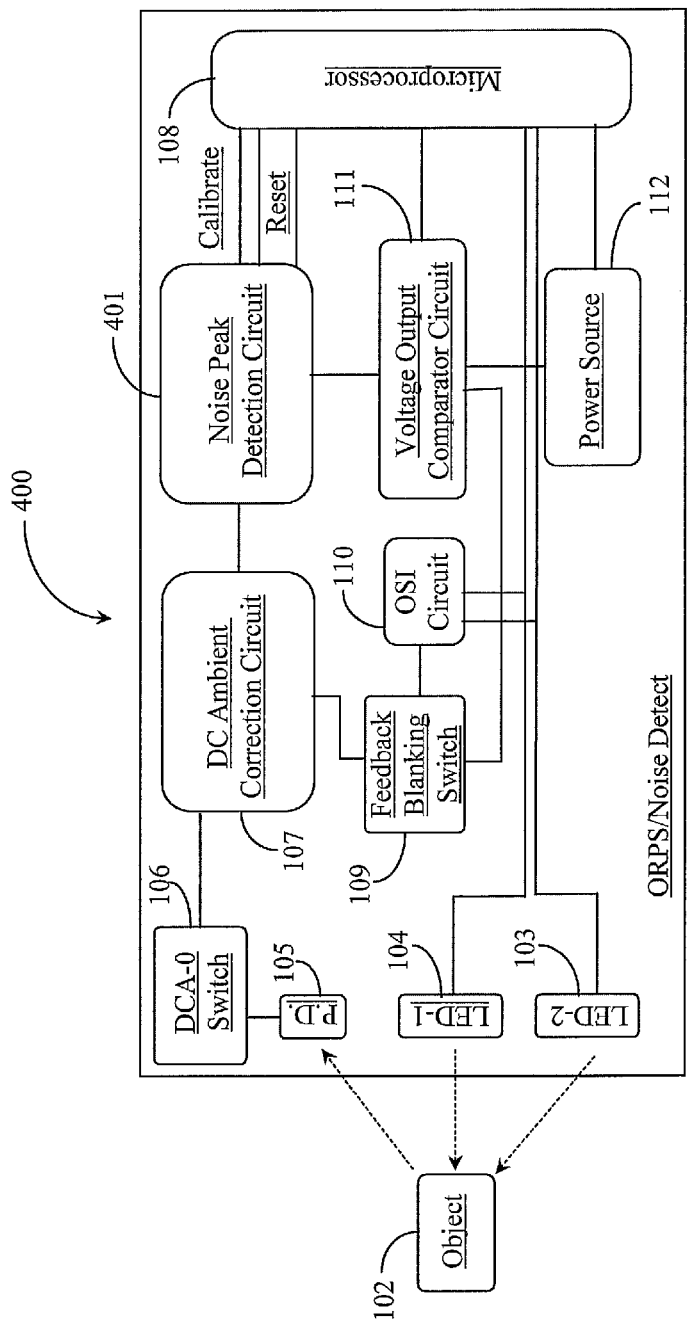
FIG. 4 is a block diagram of an optical reflectance proximity sensor according to another embodiment of the present invention.

FIG. 4 is a block diagram of an optical reflectance proximity sensor 400 according to another embodiment of the present invention. Sensor 400 is similar in some respects to sensor 100 described with reference to FIG. 1 and contains many of the same components that may be attributed the same descriptions. Therefore, elements of FIG. 1 also present in FIG. 4 and which are not significantly altered in this embodiment shall retain their same element numbers and shall not be re-introduced or described.

Sensor 400 is configured in this example as an active ORPS enhanced with additional noise detection capabilities. Sensor 400 includes LEDs 104 and 103 and PD 105 as previously described. Only one LED is required in this example. Additional LEDs may be optionally added. Like sensor 100, sensor 400 includes DCA-0 switch 106 and DCACC 107. DCACC 107 connects to FBS 108, which in turn has connection to OSI circuit 110. FBS 109 also has a direct connection to VOCC 111. The traces illustrated in this example are logical traces only and are not meant to represent actual circuitry paths. Microprocessor 108 may be an on board or off-board processor. Power source 112 may be batteries or some other power supply either onboard or off board depending on the sensor application.

In this embodiment, sensor 400 includes a noise peak detection circuit (NPDC) 401 adapted to detect DC ambient peaks caused by rapidly changing DC ambient conditions. NPDC 401 is connected to DCACC 107 on the input side of the circuitry loop. NPDC 401 is also connected to the input of VOCC 111. In this example, the output of DCACC 107 is also connected through FBS 109 to the input of NPDC 401.

In this embodiment, sensor 400 provides a noise peak detection period after the normal calibration performed by DCACC 107 in sensor 100 and in sensor 400. Although calibrating by measuring average DC ambient noise and canceling that noise provides feedback immunity against varying background ambient light that the photodiode 105 receives, the cancellation function is more effective against slowly changing ambient light from incandescent lights, for example, and less effective against rapidly changing ambient light such as may be sourced from electronic ballast fluorescents lights in the 20 to 80 KHz range. Rapidly changing ambient light such as from a florescent source can cause spurious proximity detection.

NPDC 401 is adapted to kick in during a period after the normal DC ambient calibration process is complete. For reference, a peak detection period inserted into the process before LED TX enable may consume several hundred microseconds or more. During such a period, NPDC 401 forces the DC ambient amplitude to be larger than the average ambient peaks detected during normal calibration by some set margin. This is accomplished by storing a variable voltage representing the highest peak values detected in VO measured during the second calibration period in a capacitor that can be discharged by closing a switch during the proximity detection cycle. Before the LED TX is enabled, NPDC 401 applies the added voltage to the input of DCACC 107 to force the baseline voltage VO to go negative thereby ensuring that all of the peaks detected are below Vref. The peak detection method will be described in more detail below.

Figure 5:
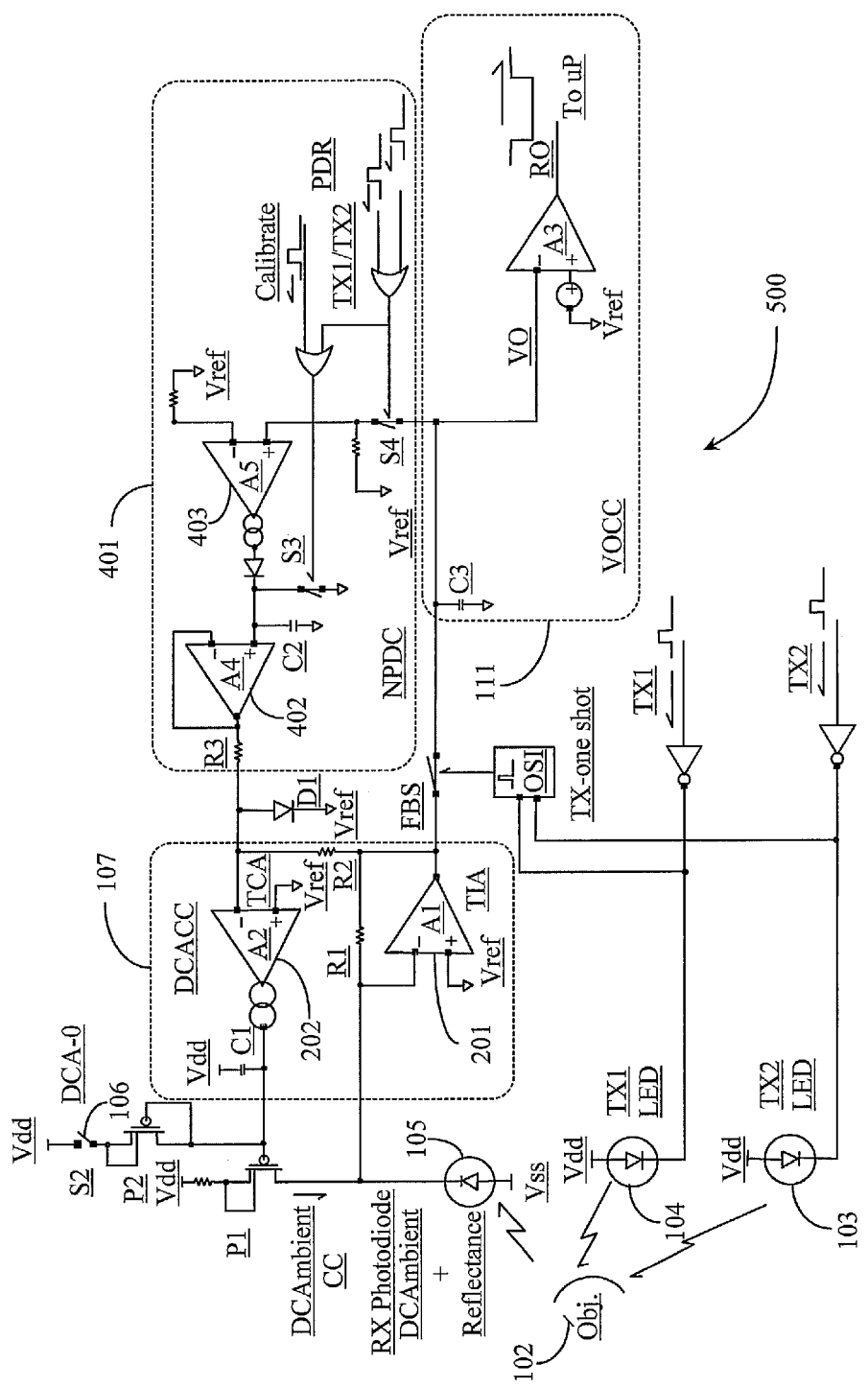
FIG. 5 is a circuitry diagram of the sensor of FIG. 2.

FIG. 5 is a circuitry diagram of sensor 400 of FIG. 2. Circuitry 500 contains many of the same components as circuitry 200 described further above. Both circuits perform the basic functions described with reference to FIG. 2 circuitry 200. Circuitry 500 is enhanced with a NPDC 401 described above in FIG. 4 but illustrated in more detail in this example.

Basic circuit elements that are present in both FIG. 2 and in FIG. 5 shall retain their same element numbers and shall not be reintroduced. One with skill in the art of circuit construction will appreciate the addition of NPDC 401 does not significantly alter the basic functions of the previous circuit elements described in FIG. 2 and illustrated again in this example. More particularly, circuitry 200 of FIG. 2 may be enhanced by adding NPDC 401 to produce circuitry 500 without departing from the spirit and scope of the present invention.

NPDC 401 includes an amplifier 402 (A4) and an amplifier 403 (A5). Additional switches (S) are provided within NPDC 401 including S3 and S4. S3 is provided to enable discharge of a capacitor C2 within NPDC 401 that when charged holds the extra peak detect voltage applied to increase sensitivity. In the calibration cycle and in the LED TX cycle S3 is held open. S4 is held closed during calibration and is held open during LED TX in part to prevent C2 from discharging prematurely.

NPDC 401 has an input terminal connected to S3 for inputting a calibration signal through a gate. NPDC 401 has an input terminal connected to S4 for input of proximity detection reset (PDR) reset signals entering S4 through a gate.

Amplifier A5 functions as the peak detector that stores a variable voltage equal to the peak value of VO if detected above Vref on capacitor C2 during the second calibration period for florescent noise. In this particular example, amplifier A5 is a transconductance amplifier having a voltage input and a current output. Transconductance amplifier A5 is used to drive capacitor C2. For this period switch S4 is closed and switch S3 is open. Amplifier A4, applies the peak voltage value through a resistor (R3) to the input of A2 in DCACC 107. This added voltage causes the output of A1 in DCACC 107 to become negative keeping the voltage at A2 inverting input the same as Vref at the non-inverting input. The normal baseline of VO stays negative keeping all peaks below Vref. This assumes that the proper ratio of R2 to R3 has been selected during circuit design.

The main difference in the use of a transconductance peak amplifier instead of a peak amplifier and limiting diode is that C2 becomes an integrator that increases in voltage stored if VO rises above Vref anytime during the second phase of the calibration period for florescent noise. The increase in C2 causes an increase in the DC ambient offset forcing VO downward so that the amplified noise peaks are at or below Vref which is below the threshold proximity detection level.

Switch S2 is opened during the proximity-sensing cycle to prevent any change in value stored in C2. Proximity sensing then occurs relying on a detection threshold value that is increased above the typical ambient value determined by the peak noise during the calibration period. This reduces the probability that noise from a same fluorescent light source will detect proximity spuriously. At the end of the proximity-detection cycle and before the next calibration cycle, switch S3 is closed to discharge C2.

Figure 6:
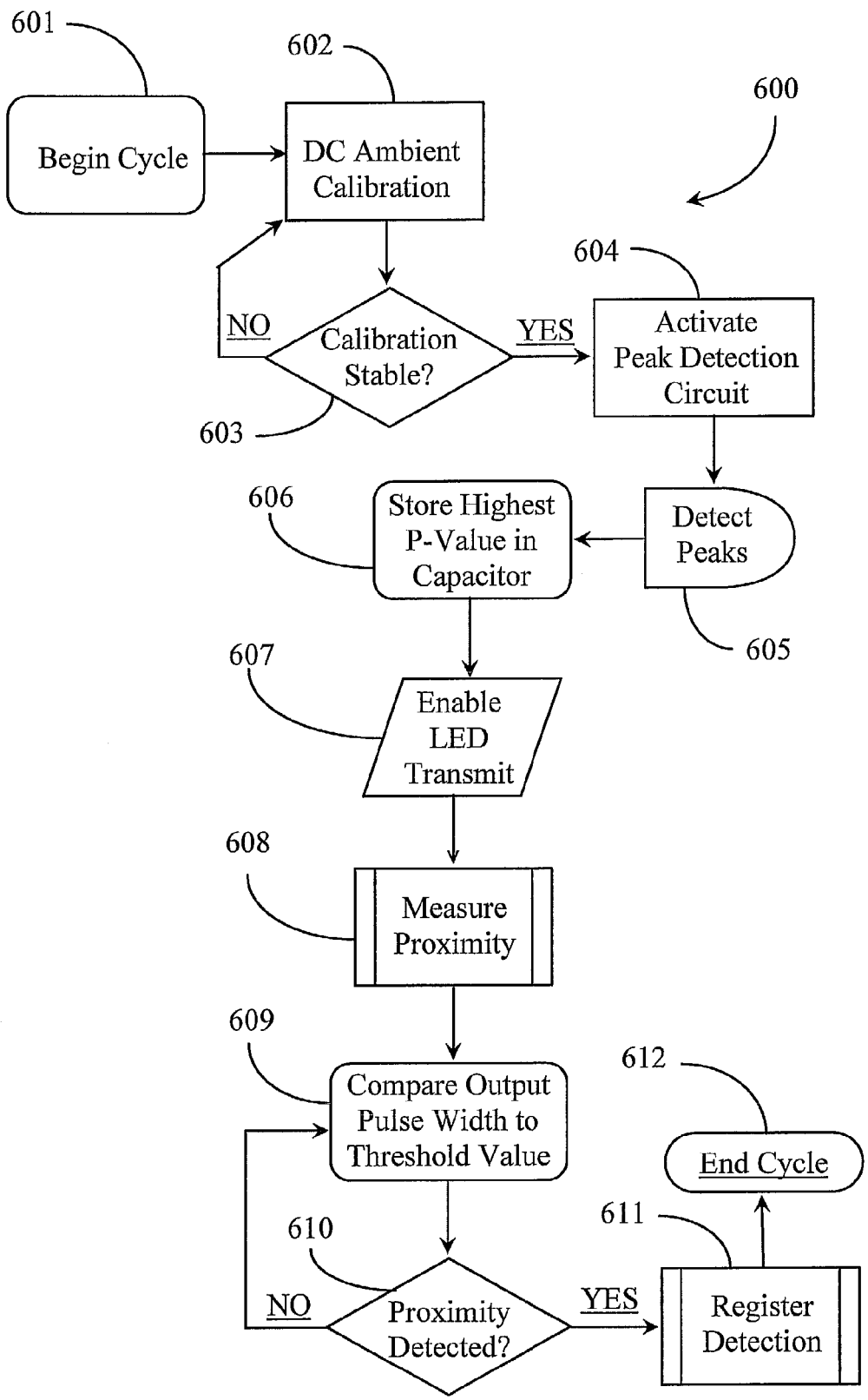
FIG. 6 is a process flow chart illustrating steps for sensing proximity using the sensor of FIG. 2 according to an embodiment of the present invention.

FIG. 6 a process flow chart illustrating steps 600 for registering proximity using the proximity sensor of FIG. 5 according to an embodiment of the present invention. At step 601 the cycle begins. At step 602 calibration for DC ambient light is undertaken. Step 602 occurs over a specific period of time. At step 603 it is determined if the calibration loop has settled from initial calibration spikes. If the calibration loop has not settled in step 603 then the process moves back to step 602 until the calibration loop is settled. During the initial calibration sequence and after the loop has settled in step 603, a noise peak detection circuit analogous to NPDC 401 of FIG. 4 is activated. In step 605 the circuit detects peaks in the DC ambient current.

At step 606, the highest peak value is stored in capacitance (C2) as an applicable charge voltage. After the peak detection and value storage is finished, the LED TX function is enabled in step 607 for proximity detection during a proximity detection cycle. At this time a switch analogous to S4 of FIG. 5 is held open to prevent the capacitor value of C1 from discharging. In step 609, the output pulse width received into a VOCC such as VOCC of FIG. 5 is compared with the detect threshold value. The detection of DC ambient spikes during the second period of calibration for florescent noise that are above the settled DC ambient level established in the first calibration period causes C2 to rise and subsequently force VO below Vref, which may be set at or below the proximity detection detect threshold. Therefore, spikes due to ballast driven florescent lighting do not trigger spurious proximity detection as those peaks are forced below Vref.

At step 610 it is determined if proximity has been detected. If proximity has not been detected at step 610, the process loops back to step 609 until a proximity event occurs or until a planned sleep cycle occurs. It is not absolutely required that a proximity event occurs during any specific proximity measurement cycle. The cycles described above include a DC ambient calibration cycle, a noise peak detection cycle, and a proximity measurement cycle. During the calibration period, including the noise peak detection period, the LED TX function is disabled. At step 610 if proximity is detected, registration of the detection occurs in step 611. The cycle ends at step 612. Inserting a noise peak detection cycle into the process ensures that there is ample margin between average ambient light pulse width and a pulse width that would be considered a result of reflectance. In this embodiment, current spikes in the photodiode representing rapidly spiking ambient light from fluorescent ballast controlled lighting is accounted for as ambient light conditions and does not trigger a proximity event.

Figure 7:
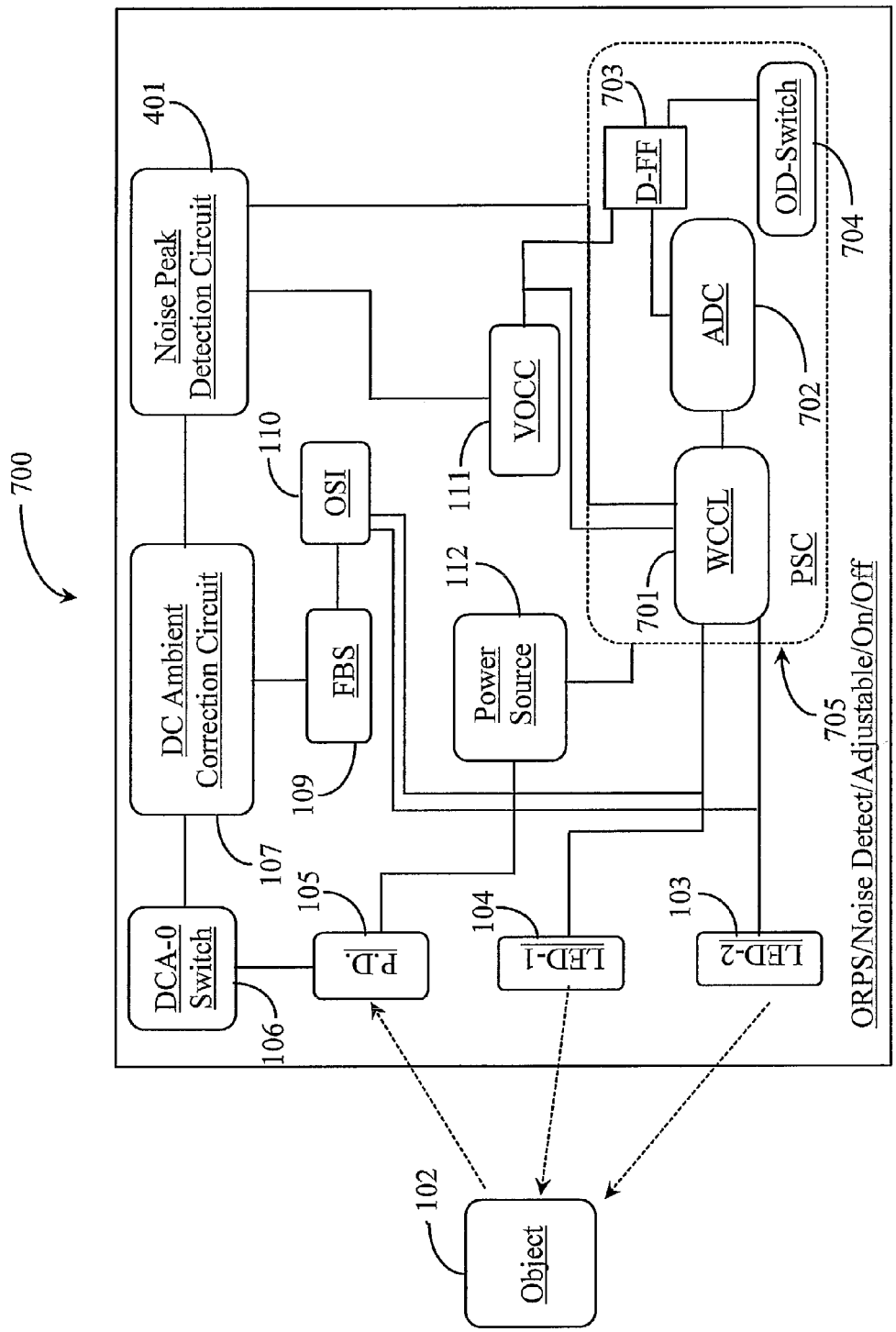
FIG. 7 is a block diagram of an optical reflectance proximity sensor according to a further embodiment of the present invention.

FIG. 7 is a block diagram of an optical reflectance proximity sensor 700 according to a further embodiment of the present invention. Sensor 700 includes all of the components illustrated in sensor 100 of FIG. 1 and sensor 400 of FIG. 4. Components present in this example are also present in the examples of FIG. 1 and FIG. 4 shall retain their same element numbers and shall not be re-introduced. A microprocessor is not illustrated in this example and may not be required to practice the present invention in this embodiment. However, in other embodiments a microprocessor may be provided and may be used to control LED TX by proxy and to further process output from the proximity sensor.

In this example, a power saving circuit, or more particularly a proximity sampling circuit (PSC) 705, is provided within sensor 700 to enable adjustment of proximity sensitivity and to enable a lower power requirement. PSC 705 is adapted to periodically sample proximity measurements and has a memory of a last proximity status between proximity measurement cycles. PSC 705 includes a wakeup cycle control logic (WCCL) module 701 having TX connectivity to LED 103 and to LED 104. WCCL 701 is adapted in this example, to control LED TX function based on input. WCCL 701 has a connection within PSC 705 to an adjustable delay circuit (ADC) 702 that is adapted to provide a clock signal to a D-flip flop (D-FF) circuit 703, which in turn provides proximity output to an output driver (OD) switch 704 to control the switch.

PSC 705 enables sensor 700 to function as an adjustable proximity on-off sensor. WCCL within PSC 705 is connected in circuitry to NPDC 401 in order to control opening and closing of the switches (S2 and S3) within the NPDC. In this embodiment, proximity sensitivity adjustment may be a manual adjustment or an automatic adjustment accomplished via a sensitivity adjustment algorithm.

In basic configuration, VOCC 111 is connected at output to D-FF 703 so that RO is input into the flip-flop circuit. ADC 702 has an output clock signal that is also input into D-FF to govern sampling and latching of proximity state of RO at a given sampling frequency defined by the clock signal. In this example an adjustable delay cycle may occur when LED TX is enabled. The delay period is preset and expires at which time an edge trigger is produced by ADC 702 into the clock input of D-FF 703. This trigger causes the D-FF to latch the input (RO) value coming in from VOCC 111. Through adjusting the clock trigger delay (retarding or advancing the trigger), the threshold value of sensor 700 may be raised or lowered and set. The receiver pulse width is proportional to the reflectance pulse width in the event of proximity. In practice, if the adjusted delay period is shorter than the RO pulse width output from VOCC 111, then clocking D-FF during LED TX will detect proximity. On the contrary, if the pulse width output from VOCC 111 is shorter than the adjusted delay then proximity will not be detected. Hence, by adjusting the clock delay signal, proximity threshold sensitivity can be set either by the user or by some automatic algorithm.

D-FF 703 remembers the last proximity state that occurred between wake-up cycles, which are enabled by WCCL 701. Therefore there is no change in proximity status between cycles. This method is very practical in embodiments where the sensor turns another electronic device on or off under the control of OD-switch 704. A device controlled by sensor 700 enhanced with PSC 705 will not power off and on between wakeup cycles unless the proximity condition changes during the proximity measurement cycle.

Another advantage of this proximity sampling technique over a continuous proximity measurement function is that it allows for tradeoffs between the proximity-sampling rate and the power consumption. For example, an on-off proximity circuit implemented in 0.6 u BiCMOS, sampling at 2 samples per second and set for a proximity detection range of half a meter consumes only about 10 microamperes. The low power requirement is suitable for many battery-powered applications. Moreover, the variable sampling time controlled by the clock trigger provides control over output debouncing.

Figure 8:
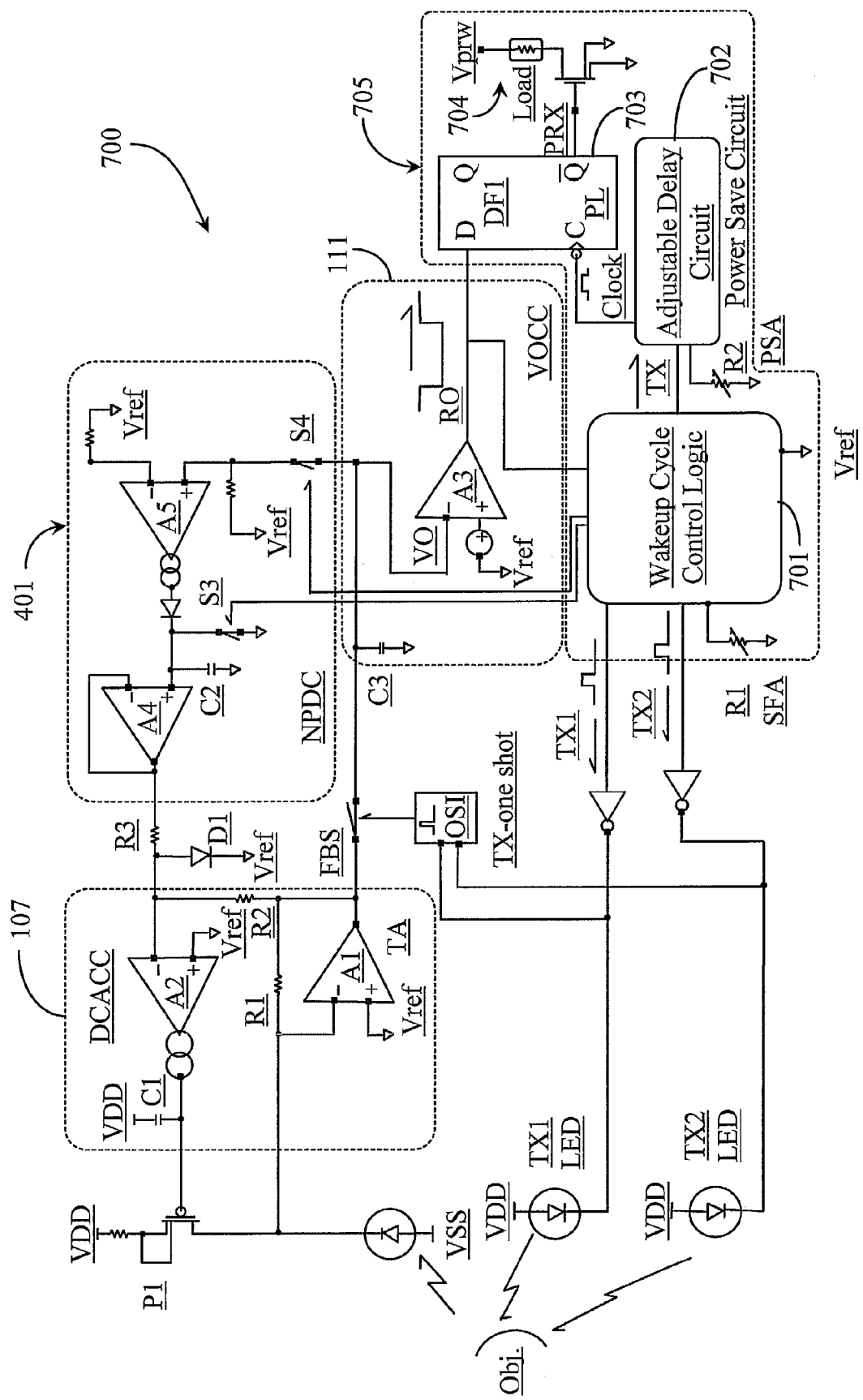
FIG. 8 is a circuitry diagram of the sensor of FIG. 7.

FIG. 8 is a circuitry diagram 800 of sensor 700 of FIG. 7. In this example circuitry 800 is that of sensor 700 described just above with reference to FIG. 7. Circuitry 800 includes DCACC 107 and VOCC 111 described further included in the basic sensor circuit of the invention. Circuitry 800 also includes NPDC 401 described further above as an enhanced calibration circuitry added to the basic circuit of the present invention. In this example PSC 705 is provided to enable a power saving operation or mode for sensor 700 by engaging in periodic sampling of the RO pulse width during proximity measuring. Circuit 705 also provides a mechanism for manually or for automatic adjustment of the proximity sensitivity threshold value used by the sensor to determine proximity.

In this example, WCCL 701 controls LED TX function for LED (TX1) and LED (TX2). There may be more than two LEDs in this embodiment without departing from the spirit and scope of the present invention. Likewise, one or more LEDs in this example and in the other examples presented above may be an RF LED without departing from the spirit and scope of the present invention. Such a case embodiment will be described in more detail later in this specification.

WCCL 701 has a control signal output to switch S2 in NPDC 401 and to switch S3 in NPDC 401 for the purpose of opening and closing the switches according to the appropriate cycle of measurement and/or calibration. WCCL 701 has a sample frequency-adjusting (SFA) resistor R1 for adjusting the sample frequency. A TX feed back signal from WCCL 701 is input into ADC 702. ADC 702 includes a proximity sensitivity adjustment (PSA) resistor R2. An output clock signal from circuit 702 is input into D-FF 703 at its clock input terminal. WCCL 701 is grounded and has an additional input from VOCC RO, which is also output into D-FF 703. The RO input from VOCC 111 into WCCL 701 determines cycling where LED TX function is concerned. The voltage across resistor R2 of ADC 702 is manipulated to advance or to retard the edge trigger input into the clock signal that is received at the clock input on the flip-flop circuit. Output (PRX) from D-FF 703 is used to control on/off OD switch 704. The threshold can be raised or lowered by manipulation of R2 of ADC 702.

It will be apparent to one with skill in the art that the low power reflectance proximity sensor of the present invention may be implemented using all of or a combination of the circuits described so far in this specification without departing from the spirit and scope of the invention. For example, a circuit may be provided that includes the DCACC 107 of FIG. 1 and the PSC 705 of FIG. 7 while not including the NPDC 401 of FIG. 4. In the separate embodiments described thus far, each proximity sensor circuit determines proximity based on a measurement of pulse width of reflectance compared against a threshold value, below which proximity is not detected. In one embodiment, correction for DC ambient light is further enhanced for noise peak detection practical for rapidly changing ambient light such as from a florescent source. In one embodiment, sensitivity for detecting proximity may further be manually or automatically adjusted to raise or lower the threshold value used to determine the presence reflectance that is considered a proximity event.

Figure 9:
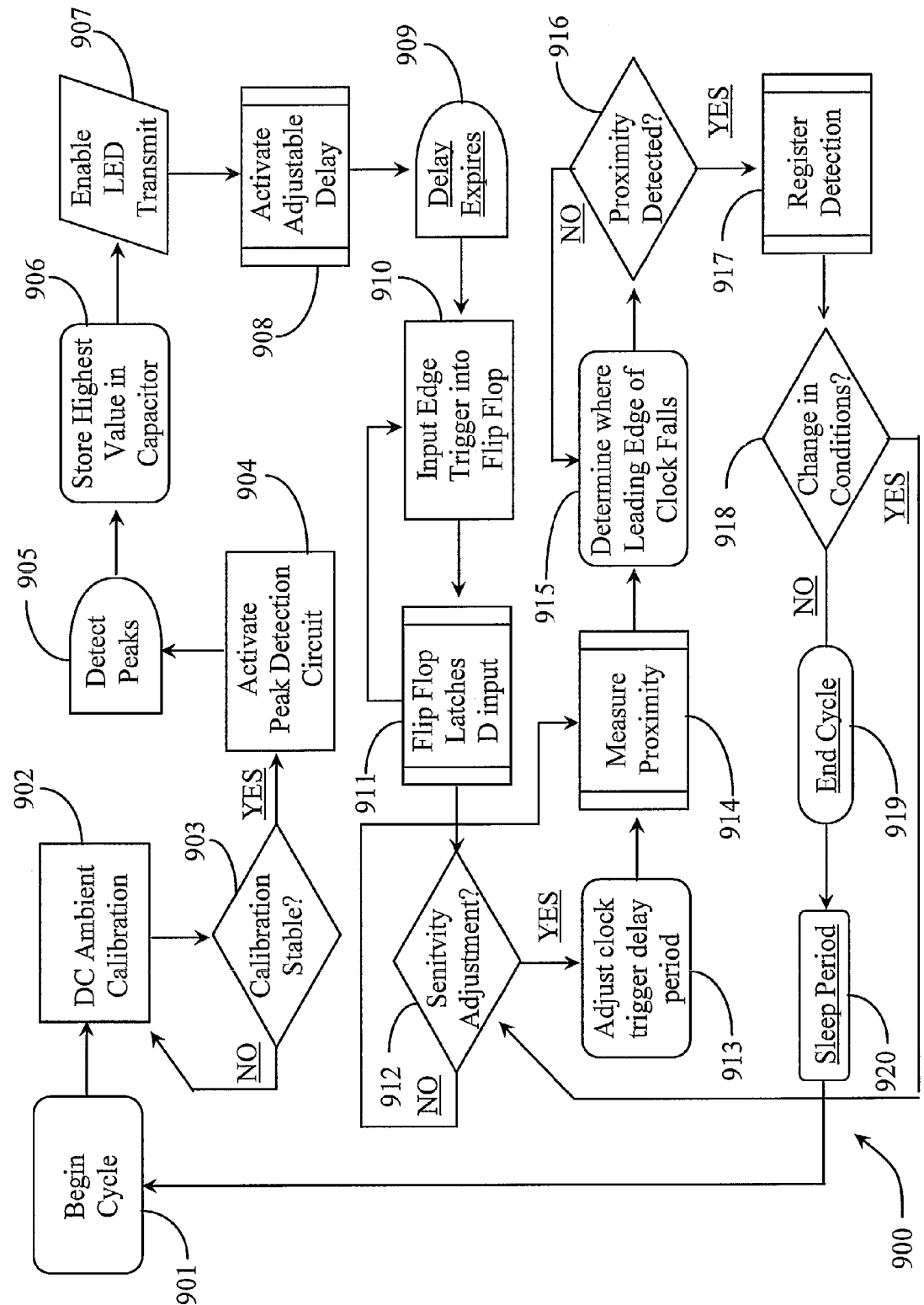
FIG. 9 is a process flow chart illustrating steps for sensing proximity using the sensor of FIG. 7 according to an embodiment of the present invention.

FIG. 9 is a process flow chart illustrating steps 900 for sensing proximity using sensor 700 of FIG. 7 according to an embodiment of the present invention. In step 901a cycle begins for DC ambient calibration. In step 902 calibration for DC ambient light continues. In steps 901 and 902, the circuit measures DC ambient light received at the photodiode with the LED TX function disabled.

At step 903 it is determined if the DC calibration loop has stabilized. In step 903, if the loop is not stable, then DC ambient calibration continues at step 902. If the loop is stable meaning that there are no more adverse spikes in the DC ambient current generated at the photodiode, then at step 904, the peak detection circuit is activated. This step is optional and not absolutely required to practice the present invention. However, detecting ambient peaks from unstable florescent sources and the like is useful in further increasing the proximity sensitivity capability. At step 905, ambient peaks are detected and the highest peak value is stored in a capacitor at step 906. LED TX is disabled during the entire calibration period for ambient light and for noise peak detection. One may assume that there are two separate calibrations performed; one for normal ambient light and one for ambient spikes from ballast-controlled florescent lights or other transient sources. However, since both calibrations are performed before TX LED, one might describe it as a single calibration process having two stages; one for normal ambient where the loop settles and then one for noise peaks.

At step 907, LED TX is enabled. At this time, DC ambient peak pulse width is known and applied in ambient correction during the proximity measuring cycle where LED TX is enabled. Just after enabling LED TX in step 907, an adjustable delay period is activated in step 908. At step 909, the delay period activated in step 908 expires. At step 910 the adjustable delay circuit inputs an edge trigger into the flip-flop clock input signal. The edge trigger causes the flip-flop to latch the D input at step 911. This sampling cycle is repetitive sampling RO periodically.

Optionally, at step 912 it is determined if a sensitivity adjustment is required. If it is determined that no adjustment is necessary, then in step 914 a proximity measurement cycle begins. At step 915, the circuit determines where the edge of the delay trigger falls with reference to the RO pulse width. At step 916, it is determined whether proximity was detected. If not, sampling may continue and the process may revert back to step 915 and back to 916 until the circuit registers a proximity event.

At step 916, if proximity is detected, then the event is registered at step 917. In this case, the circuit remembers the last proximity state and unless proximity conditions change in step 918 the cycle may end in step 919. There may be a sleep period in step 920 before beginning another cycle looping back to step 901. If there is a change in proximity conditions, then the process may loop back to step 912 where it may be determined if another sensitivity adjustment is required. Changing proximity conditions or parameters may be as simple as lengthening or shortening the field of view of the sensor for sensing an object by reflectance. Application of one or more lenses where they were not required before might constitute a change in proximity conditions or parameters. Adjusting for the size of an object may constitute another change in proximity conditions.

Figure 10:
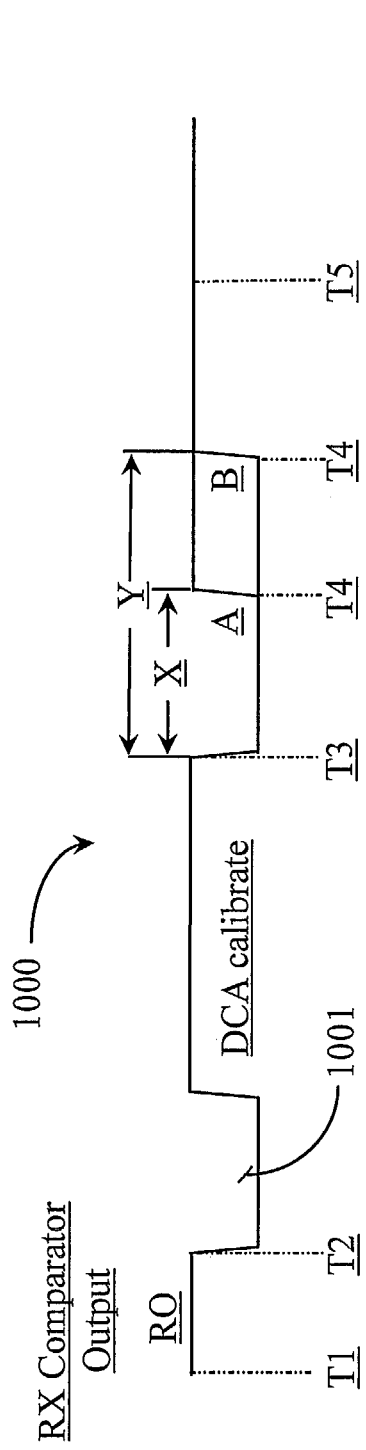
FIG. 10 is a waveform timing-chart illustrating reflectance signals in output of a comparator circuit relative to the basic circuit of FIG. 2 according to an embodiment of the present invention.

If back at step 912, it is determined that a sensitivity adjustment is warranted, then at step 913 the clock delay period may be adjusted by advancing the edge trigger or by retarding it. After the edge trigger has been adjusted, then the process reverts back to step 914 for the start of the proximity measurement process. In this example, reflectance may be determined by the VOCC as per threshold comparison, but a second look by clocking the D-FF enables adjustment ergo fine-tuning of the sensor. In the embodiment presented the output of the D-FF controls an on/off output driver switch. Therefore the output of the flip-flop is either proximity detected or proximity not detected. So while the VOCC may show some reflectance over DC ambient, that does not guarantee proximity detection FIG. 10 is a waveform timing-chart 1000 illustrating reflectance signals in output of a comparator circuit relative to the basic circuit of FIG. 2 according to an embodiment of the present invention. Waveform 1000 represents the output signal RO from a receive detect comparator described further above in FIG. 1 and elsewhere in this specification as voltage output comparator circuit (VOCC) 111. At time T1 the sensor powers up and at time T2 DC ambient calibration and measurement begins. Signal 1001 represents a DC ambient signal measured at the comparator output during calibration. With no LED TX signal 1001 has a pulse width that is proportional to the time it takes for the circuit to cancel the DC ambient signal. By time T3 the DC ambient loop has settled and the correction current for DC ambient is established. At time T3 TX LED is started for measuring proximity. With LED transmit (TX) on the photodiode may pick up a reflectance signal at T3 in the event of proximity. The total photodiode output will be the photocurrent including the DC ambient signal plus any reflectance signal.

The reflectance from the LED that is received by the photodiode causes an increase in the photocurrent above that of the background ambient level. This rise in signal current is amplified and detected by VOCC 111 (see FIG. 2). The output pulse width (RO) of the receive comparator (VOCC) is proportional to the reflected signal amplitude because with higher reflectance, the DC ambient detection circuit takes a longer time to cancel the reflectance signal.

From T3 to T4 the proximity measurement takes place. At T4 for a reflectance signal A we have a pulse width X. Pulse width X must be larger than the detect threshold or no proximity is detected. It takes the circuit from T3 to T4 (A) to cancel the reflectance signal A. At T4 for a reflectance signal B, we have a wider pulse width Y. In this case reflectance signal B is much stronger than reflectance signal A. It takes the circuit from T3 to T4 (B) to cancel the reflectance signal. The stronger the reflectance signal, the longer it takes the circuit to cancel the signal. The pulse width detected is proportional to the time it takes to cancel the reflectance.

If reflectance is detected above the DC ambient threshold then at time T4, the TX LED function is turned off and calibration begins again at T2 for the next cycle. It is important for the circuit to settle so calibration may be performed in a preferred embodiment, after each proximity event.

Figure 11:
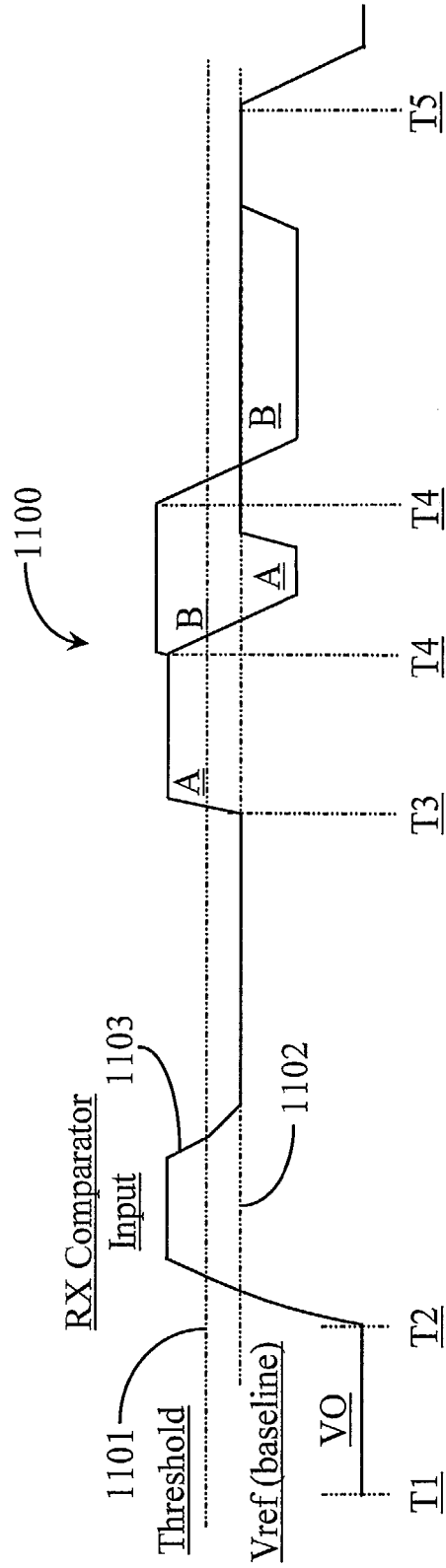
FIG. 11 is a waveform timing-chart illustrating reflectance signals in input of a comparator circuit relative to the basic circuit of FIG. 2 according to an embodiment of the present invention.

FIG. 11 is a waveform timing-chart 1100 illustrating reflectance signals in input of a comparator circuit relative to the basic circuit of FIG. 2 according to an embodiment of the present invention. Waveform 1100 represents input signal VO into the VOCC (receive detect comparator). The VOCC analogous to VOCC 111 of FIG. 2 has a reference voltage (Vref) baseline level 1102. A detect threshold signal level at the comparator circuit is illustrated in this example as threshold 1101.

At T1 the sensor powers up. At T2, the DC ambient calibration cycle begins. At T3, the proximity measurement cycle begins and TX LED is switched on. Between T2 and T3 during calibration, a spike 1102 occurs which is above threshold 1101. Spike 1101 is mitigated during calibration for DC ambient to establish the DC ambient correction current. Before time T2, there is no voltage on signal line VO into the RX comparator circuit. By time T3, the DC ambient loop has settled. At time T3 TX LED function is turned on to measure proximity.

In this example, two reflectance signals are illustrated. Signal A and signal B each represent reflectance signals. Reflectance signal A is the weaker of the two signals. At time T4 for reflectance signal A, the TX LED function is switched off causing the signal to go below Vref. The signal recovers to baseline Vref Reflectance signal B is larger than signal A. At time T4 for B, TX LED is switched off and the signal swings below Vref and eventually recovers to baseline. The pulse width is what actually determines the presence of reflectance in the signal. The time it takes to cancel a reflectance signal determines the scope of the reflectance. During repeated sampling, the time to cancel the signal may become shorter or longer during a given proximity measurement cycle indicating motion of an object that is being detected. The area between baseline Vref and the threshold level provides a margin or gray area where a reflectance signal can be detected but not considered sufficient to register a proximity event. At time T4 for reflectance signal A and B, the LED transmitter (TX) is switched off to enable the circuit to settle and the sensor May be powered off at time T5 whereby the VO goes back to zero.

Figure 12:
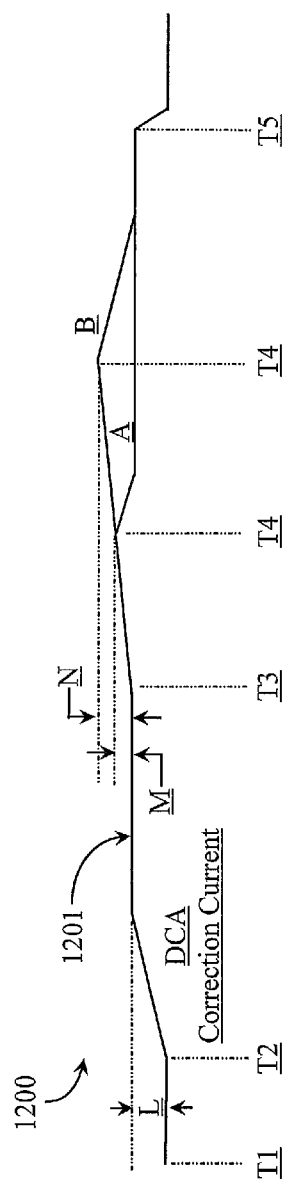
FIG. 12 is a waveform timing-chart illustrating DC ambient correction ramps for reflectance signals according to an embodiment of the present invention.

FIG. 12 is a waveform timing-chart 1200 illustrating DC ambient correction ramps for reflectance signals according to an embodiment of the present invention. Chart 1200 illustrates the DC ambient correction current that is fed back into the photodiode during calibration and TX LED. At T1, the sensor is powered on. At T2, the calibration cycle begins and DC ambient current causes an initial ramp up (L) to the DC ambient background level 1201.

At T3, the LED is powered on adding to DC ambient current causing a correction ramp up (M) from T3 to T4 for reflectance signal A. Ramp M represents the amount of time to correct for reflectance signal A. The correction ramp (N) for reflectance signal B is larger (T3 to T4). Ramp N (T3-T4 for B) represents the time required for the circuit to cancel reflectance signal B the larger of the two signals. At time T4 for signal A or signal B respectively LED TX is switched off and the signal returns to DC ambient background level.

Figure 13:
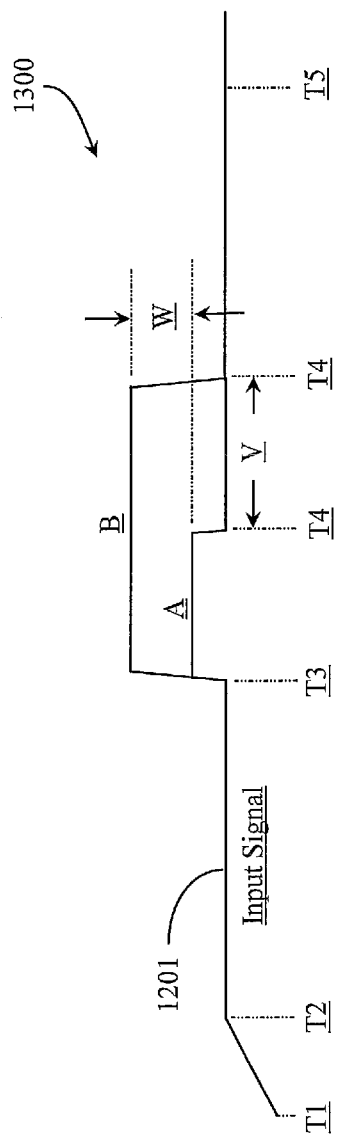
FIG. 13 is a waveform timing-chart 1300 illustrating reflectance signals at the photodiode before amplification according to an embodiment of the present invention.

FIG. 13 is a waveform timing-chart 1300 illustrating reflectance signals at the photodiode before amplification according to an embodiment of the present invention. Chart 1300 represents total input signal at the photodiode. At time T1 the sensor powers on. The signal is below DC ambient background level 102 before time T2. After time T2, the photodiode is receiving ambient light during calibration to determine DC ambient background 1201.

At time T3, the LED TX is enabled and proximity detection begins. The input signal is flat at the DC ambient background level (1201) until T3 when reflectance pulse (A) occurs. Pulse A is weaker than Pulse B. It takes longer for the circuit to cancel pulse B. The difference in peak of both pulses is W and the difference in pulse width for both pulses is V. On the input signal A is a reflectance signal and B is a stronger reflectance signal.

In practice of the most basic circuit described above in FIG. 2, when reflectance is detected above the detect threshold RO changes from high to low at the output of the VOCC. Low RO indicates proximity and the cycle may be interrupted depending on the application. In a preferred embodiment, there is a calibration period after each proximity event detected, or after low RO at the output.

Figure 14:
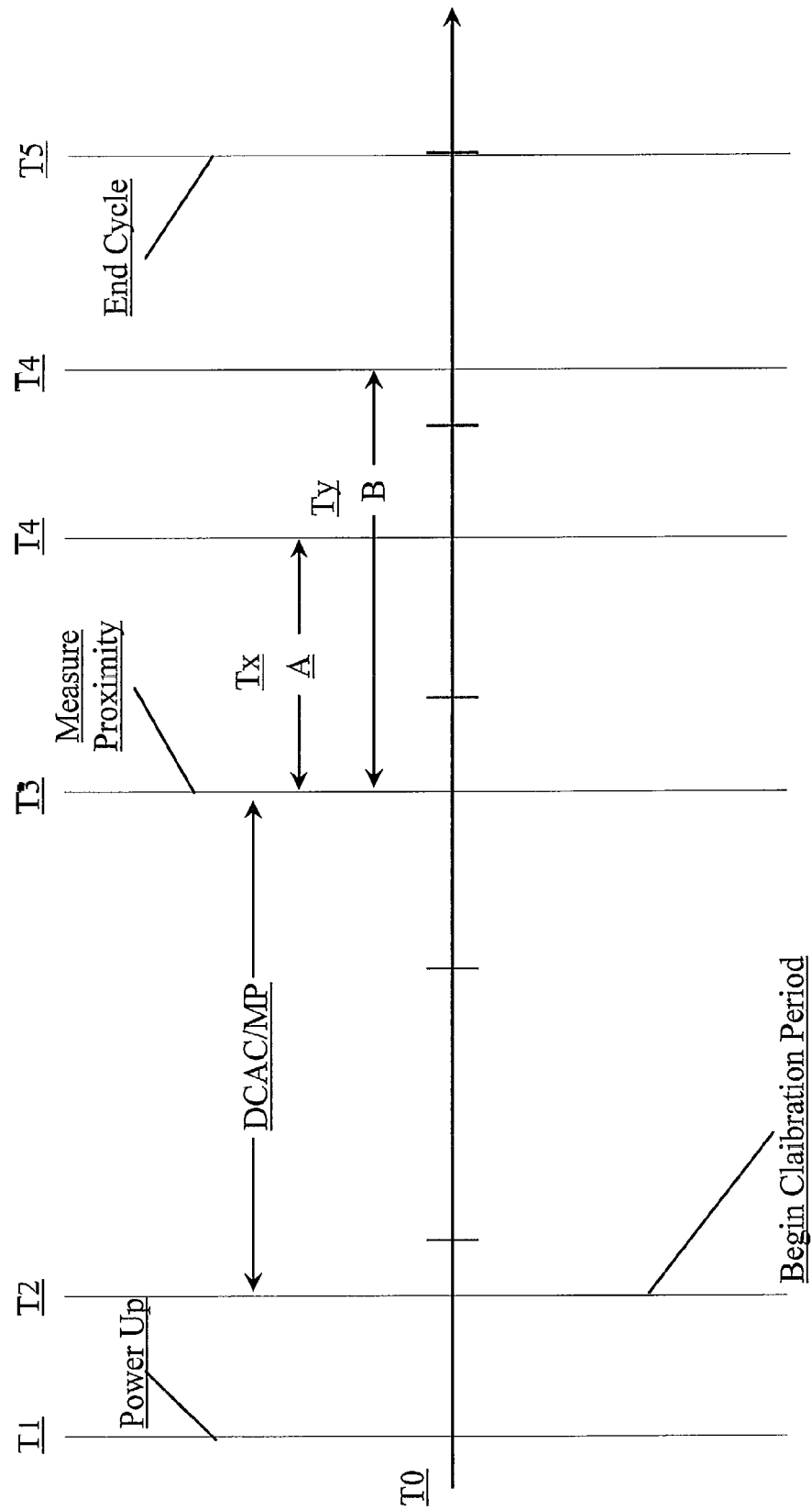
FIG. 14 is a timing chart illustrating measurement of ambient and reflectance according to an embodiment of the present invention.

FIG. 14 is a timing chart illustrating exemplary units of time for each portion of the process cycle using the process of FIG. 3 according to an embodiment of the present invention. At T0 there is no activity. At T1 the sensor powers up and begins calibration for DC ambient at T2. At 10 μsec. the process is already calibrating. The calibration period for DC ambient from T2 to T3 lasts approximately 200 μsec. marking the beginning of the proximity measurement cycle and the start of TX LED at time T3. Proximity measurement may begin before 250 or 300 μsec. have passed. Between T2 and T3 the correction circuit has calibrated for DC ambient light and the loop has settled.

The period between T3 and T4 for A is relatively short because A is a weaker reflectance pulse. 2 μsec. may be all the time (Tx) required to cancel the weaker of the two reflectance signals and detect proximity. T3 to T4 for reflectance signal B is a longer period (Ty) that may be up to 1 millisecond to cancel because B is a larger signal. At T5 the cycle ends. After T5, a sleep cycle may occur that lasts, depending on the application, anywhere from 10 ms to 1 sec. before the next T1. It is important to note herein that the times given in this example are exemplary only and may be different for each cycle depending on the application and nature of proximity. Proximity sensitivity adjustment may also affect the timing of a given cycle. One with skill in the art of analog circuits will appreciate that a considerable portion of the overall cycle time is spent calibrating and settling in order to have optimum conditions for proximity detection. The actual proximity measurement requires just a fraction of the overall process time. For more complex sensors that provide motion data such as that of an object approaching or moving laterally across the face of the sensor, there is ample opportunity to sample multiple proximity measurements in a vary short amount of time. A simple on/off application may require just one or a few sample measurements.

In one embodiment, logic may be provided to control the pulse width sampling process according to one or more rules. Likewise, where multiple TX LEDs are used, there may be logic provided to analyze motion through proximity measurement sampling. There are many possibilities.

Figure 15:
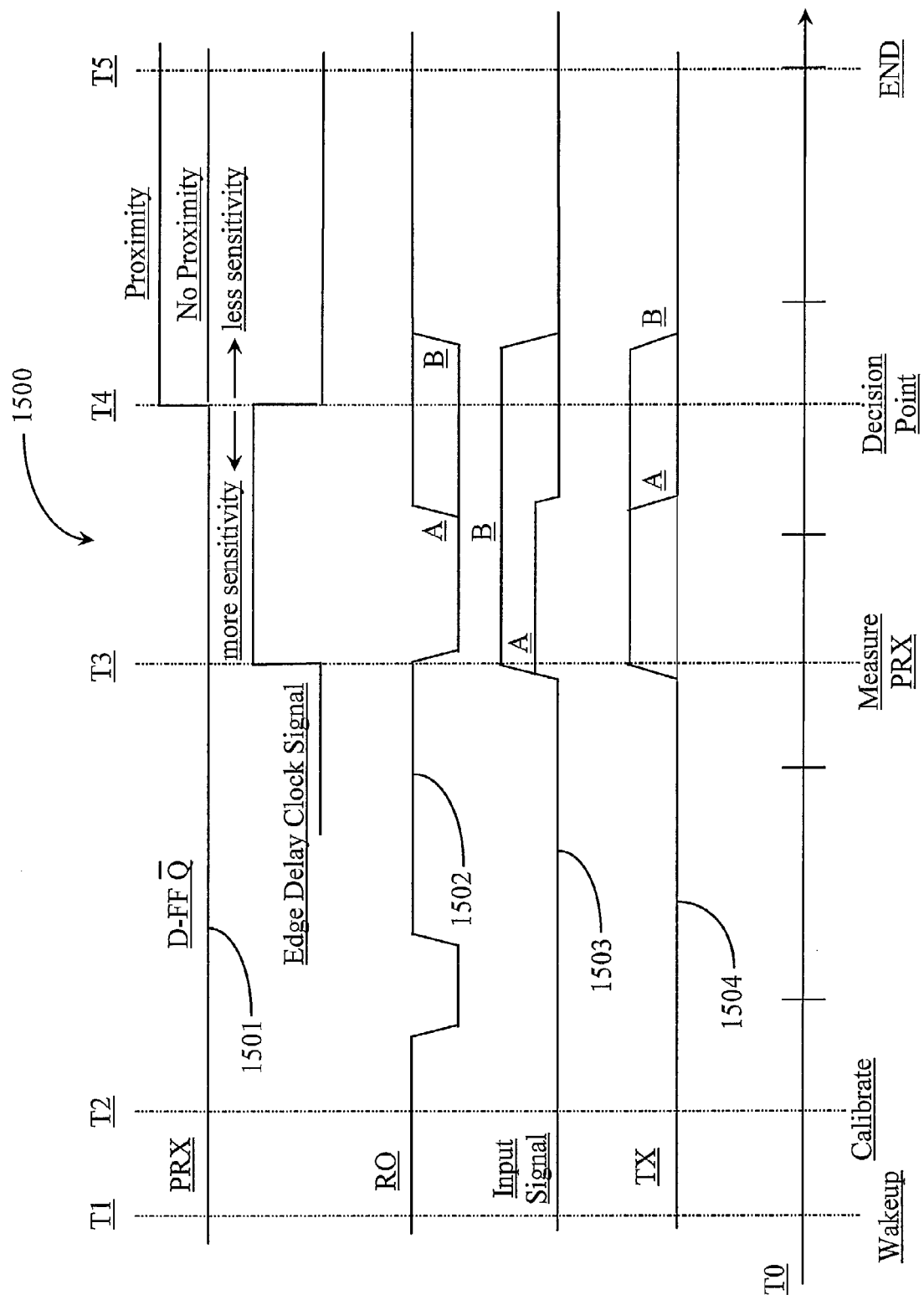
FIG. 15 is a timing chart illustrating reflectance detection sensitivity adjustment capability of the sensor of FIG. 7 according to an embodiment of the present invention.

FIG. 15 is a timing chart 1500 illustrating reflectance detection sensitivity adjustment capability of sensor 700 according to an embodiment of the present invention. Timing chart 1500 illustrates several waveforms with reference to a timing reference line beginning at time T0. This example has relevance to the embodiment using the D-flip-flop circuit illustrated in FIG. 8 and relating to the process discussed in FIG. 9 with or without the steps introduced for noise peak detection at the end of the first calibration cycle.

Beginning at the top of the chart, the first waveform represents proximity (PRX) output from the D-FF component. The output signal is represented logically as output 1501. There are two possible states coming out of the D-flip flop, proximity (0) or (1) or no proximity (0) or (1) depending on how the input is set.

From T1 to T2, the sensor may wake up from a sleep cycle of up to 1 second as discussed further above with reference to the timing charts for the basic circuit. Wake up logic is provided to initiate power up after a sleep cycle. At time T2 calibration for DC ambient begins. At time T3, proximity measurement begins. The period between T2 and T3 may optionally include a noise peak detection period added at the end of the typical calibration window.

In this example, T3 marks the beginning of proximity measurement and introduction of the trailing edge delay clock signal (illustrated just below the waveform for reference) into the flip-flop. T4 marks the end of the proximity measurement window and the decision point for determining if there will be a proximity event detected. The decision point coincides with where the trailing edge of the clock falls with reference to any reflectance pulse occurring at the latch time. The next waveform below PRX 1501 is VOCC output (RO) 1502. It is noted herein that between time T3 when the clock signal is introduced into the flip-flop and T4 where the decision is made regarding proximity detection, that the trigger edge falls at T4 somewhere into the reflectance signal B of RO.

Referring now to the edge delay clock signal, the clock input may be advanced to produce an edge that falls closer to the detection threshold of the VOCC or it may be retarded to cause the trigger to be delayed further toward the leading edge of the reflectance signal. In this case, advancing the trigger provides more proximity detection sensitivity while retarding the trigger causes less proximity detection sensitivity. For reference, the input signal (1503) at the photodiode and LED TX signal (1504) are also illustrated. At time T5, the sensor may go into a sleep cycle of up to 1 second before the next calibration cycle.

Using the adjustment mechanism on the clock, allows for a specific margin of reflectance to be ignored above the threshold detect value. The sensitivity can be advanced up to the detect threshold or it may be retarded to prevent proximity detection altogether. In this way the sensor may be set to pick up the slightest reflectance or it may be set to ignore all but the strongest reflectance depending on the application.

Figure 16:
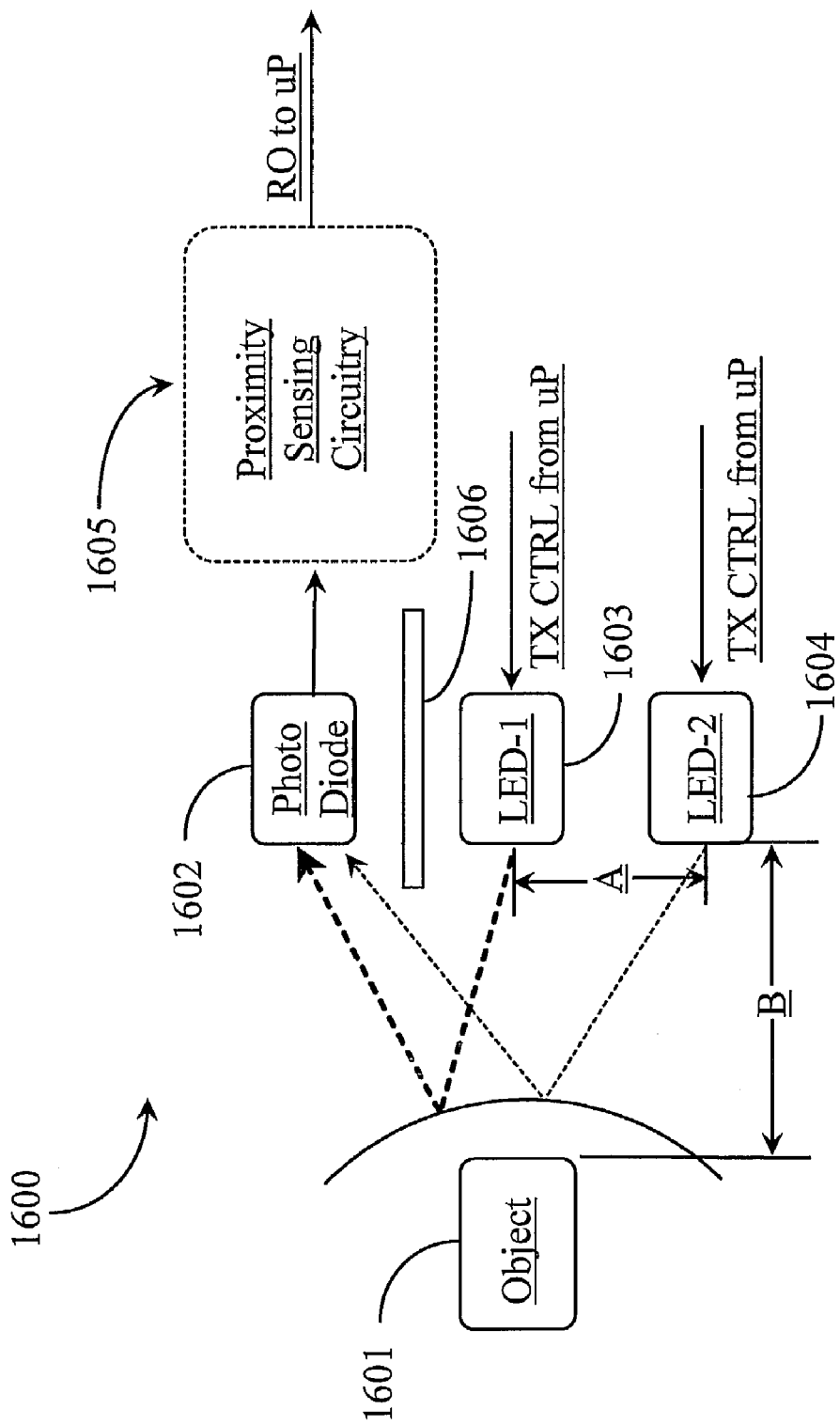
FIG. 16 is a block diagram illustrating a proximity sensor module configuration according to an embodiment of the present invention.

FIG. 16 is a block diagram illustrating a proximity sensor module configuration 1600 detecting reflectance from an object at a given distance according to an embodiment of the present invention.

Figure 17:
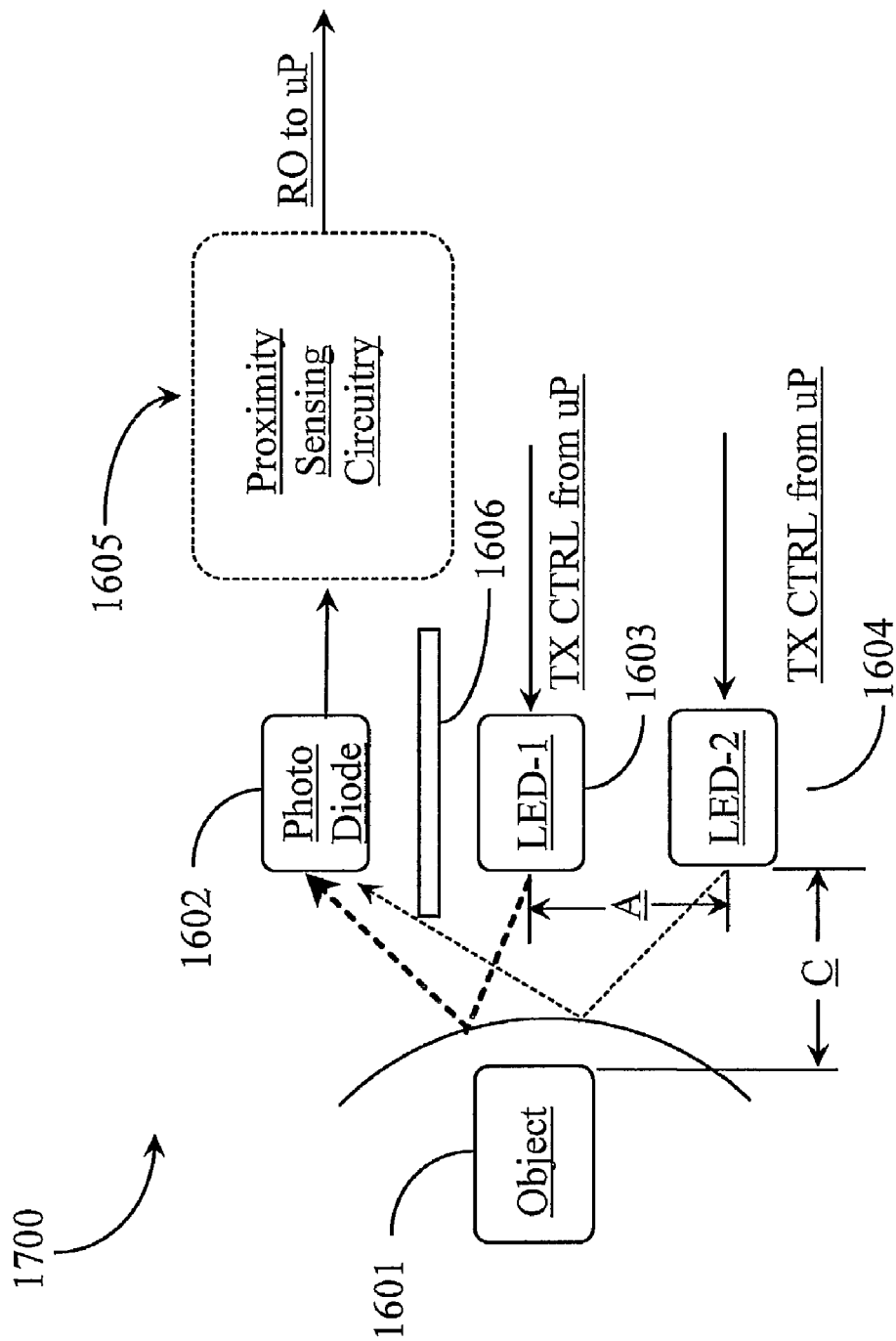
FIG. 17 is a block diagram illustrating a proximity sensor module configuration according to another aspect of the present invention.

FIG. 17 is a block diagram of the configuration of 1600 detecting reflectance from the object at a shorter distance.

Referring now to FIG. 16, sensor configuration 1600 includes proximity sensing circuitry 1605 having proximity output RO from a VOCC to a microprocessor. In this configuration, TX control is accomplished at the microprocessor as illustrated by logical control lines into LED-1 and LED-2.

In this configuration, a photodiode 1602, is optically isolated from LED-1 (1603) and LED-2 (1604) by an optical barrier 1606 that reduces or eliminates direct communication between the LEDs and the photodiode. In this example LED-1 and LED-2 are spaced apart at centerline by a distance A. Both LEDs reside on one side of the photodiode. As a result LED-2 is on the order of twice the distance A away from photodiode 1602. Also in this example, object 1601 is a distance B away from the sensor face. During TX, LED-1 and LED-2 transmit light waves toward the field occupied by object 102 and reflectance from object 102 in the field at distance C from the face of the sensor is received at photodiode 1602 as illustrated by reflectance arrows.

Due to the positioning of the LEDs with respect to the photodiode coupled with the distance B of object 1601 away from the sensor face, the reflectance signal from LED-1 at the photodiode is approximately 2× stronger than the reflectance received from LED-2. By setting a proximity detection threshold as a ratio of reflectance received between the two LEDs the difference in reflectivity of an object can be minimized. In this example, the reflectance between LED-1 and LED-2 of the object at a longer range may be less than 2 to 1 because the differences in path length of the LEDs may be less than 25%.

Referring now to FIG. 17, object 1601 is much closer to the face of sensor 1600 to a distance of C. Reflectance from LED-1 (1603) is now approximately 10× stronger than the reflectance caused by LED-2 1604. At short range C, the differences in path length may exceed 2 to 1, making the difference in reflectance more than 10 to 1. For instance, a user might set a proximity threshold to require that the reflectance of the object caused by LED-1 exceed the reflectance of the object caused by LED-2 by a factor of 10. As a consequence, the absolute value of reflectance should have less effect as long as it exceeded a set minimum value. Using a formula for LED reflectance ratio and pulse width sampling, the sensor can be calibrated to detect linear motion relative to the face of the sensor.

Figure 18:
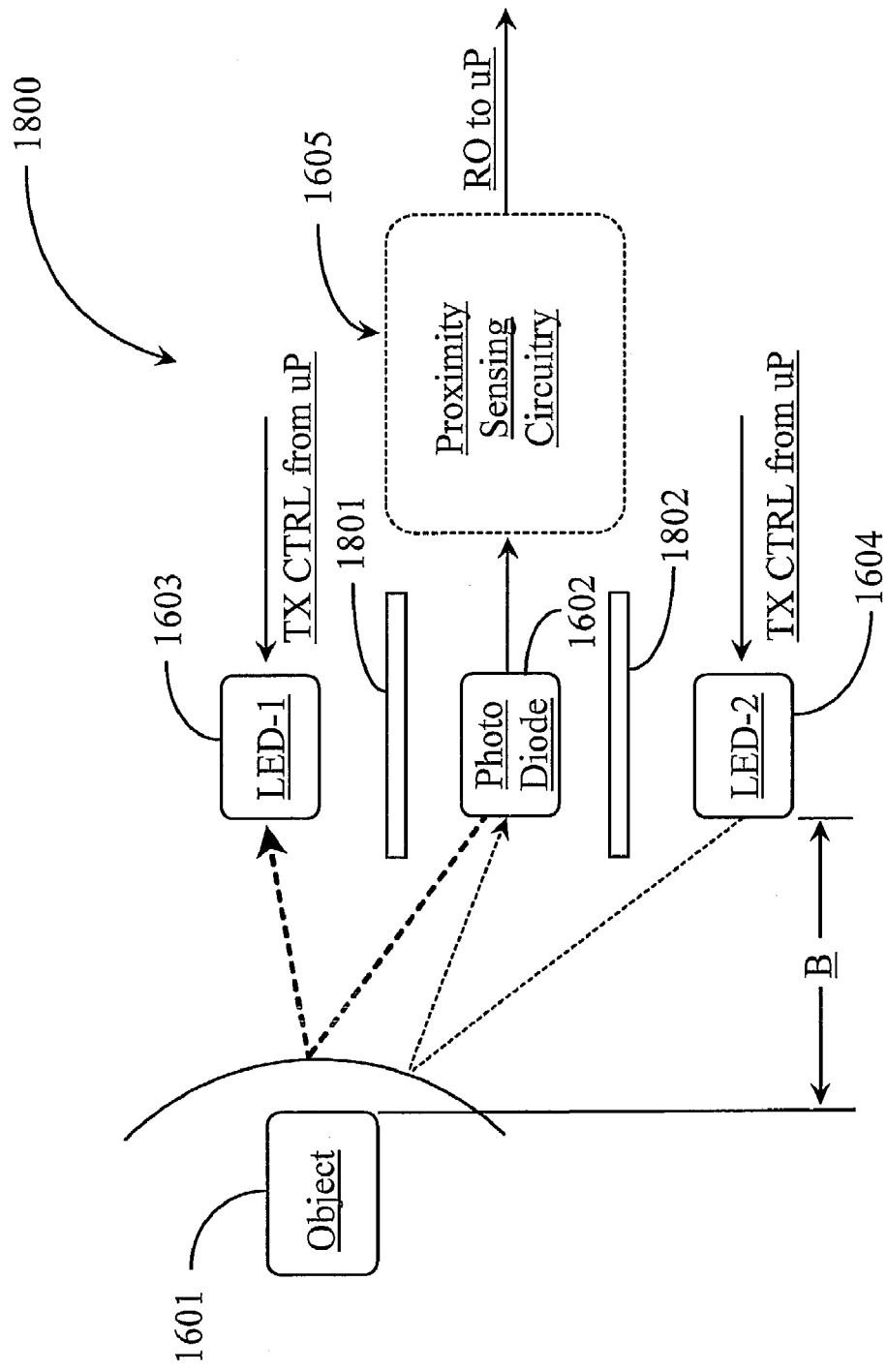
FIG. 18 is a block diagram illustrating a proximity sensor module configuration according to a further aspect of the present invention.

FIG. 18 is a block diagram illustrating a proximity sensor module configuration 1800 according to a further aspect of the present invention. In this example, photodiode 1602 is placed strategically at the center of flanking LEDs 1603 and 1604. In this example optical isolation barriers 1801 and 1802 are provided to isolate photodiode 1602 from direct communication from either LED.

In this example, object 1601 is at distance B out from the face of sensor 1800 and is positioned much closer to LED-1 than to LED-2. Because of the object position relative to LED-1 and LED-2, the reflectance picked up at the photodiode from is much stronger for LED-1 than for LED-2. Using the same principle described above, as the object moves laterally across the sensor face from LED-1 toward LED-2, the reflectance signal for LED-1 diminishes and the reflectance signal for LED-2 increases. In this example, the absolute value of reflectance must be over a threshold, but the ratio between LEDs changes proportionally for each lateral movement of object 1601 across the sensor face at distance B. In this way lateral movement of the object may be detected and understood.

Figure 19:
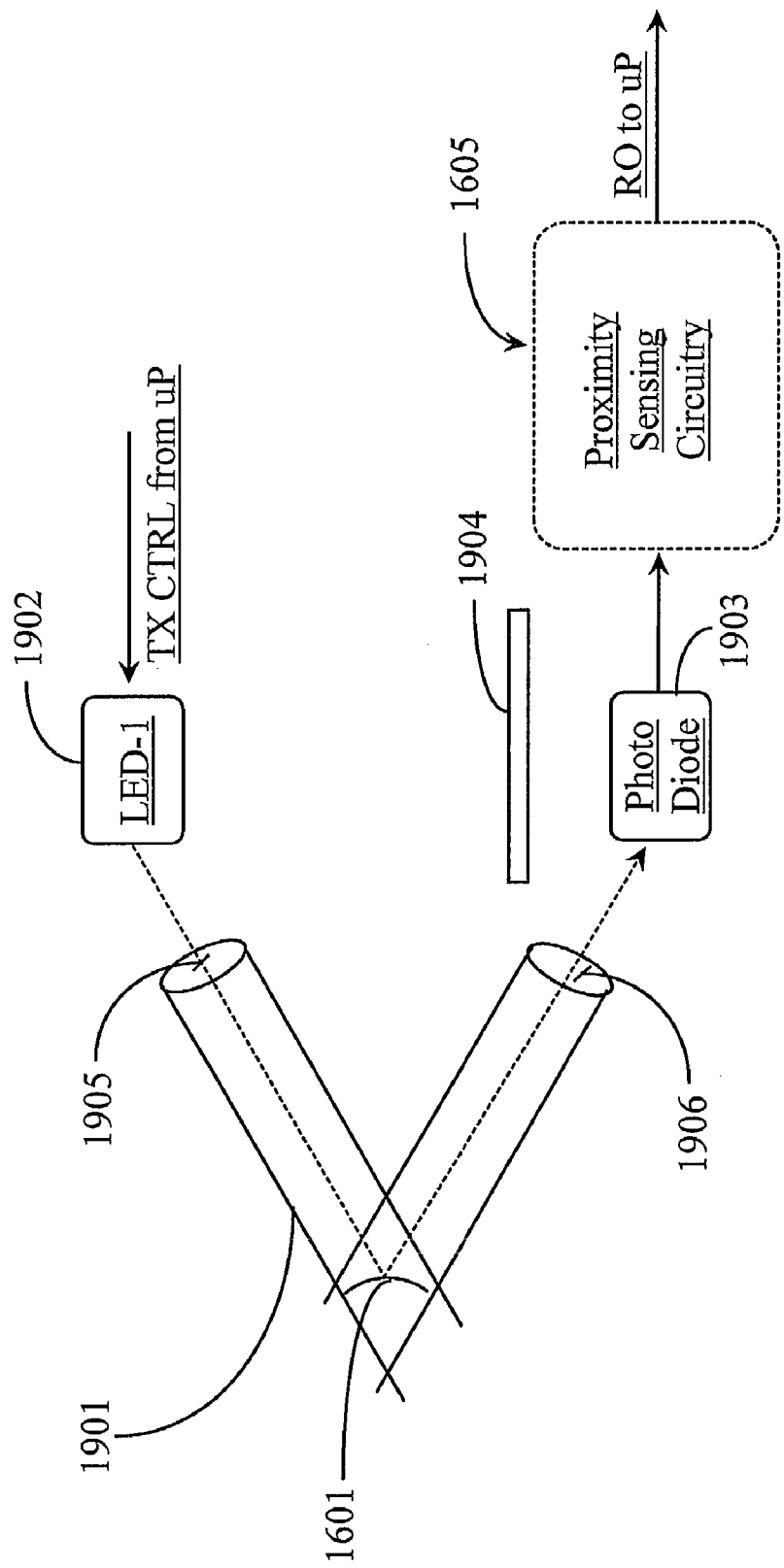
FIG. 19 is a block diagram illustrating a proximity sensor module configuration according to still another aspect of the present invention.

FIG. 19 is a block diagram illustrating a proximity sensor module configuration 1900 according to still another aspect of the present invention. In this example, a single LED-1 (1902) is spaced apart laterally from a photodiode 1903 at the face of the sensor. An optical isolation barrier 1904 is used to isolate photodiode 1903 from direct communication with LED-1 1902.

LED-1 has a lens 1905 angularly mounted in front thereof adapted to focus the light emitted by the LED toward object 102. Photodiode 1903 has a lens 1906 mounted in front thereof and adapted to focus the reflectance from object 102 toward the photodiode. The lenses may be used in part to increase proximity detection range and in part to direct or focus the light from the LED and the reflectance to the diode along a defined and specific reflectance zone 1901. By adding lenses to an array of LEDs and to a photodiode, range can be increased and position ambiguity can be reduced so that reflections are only detected when object 102 is within an optically defined zone of reflection set up between one of the array of LEDs and the photodiode. In this embodiment there may be more than one photodiode as well.

Figure 20:
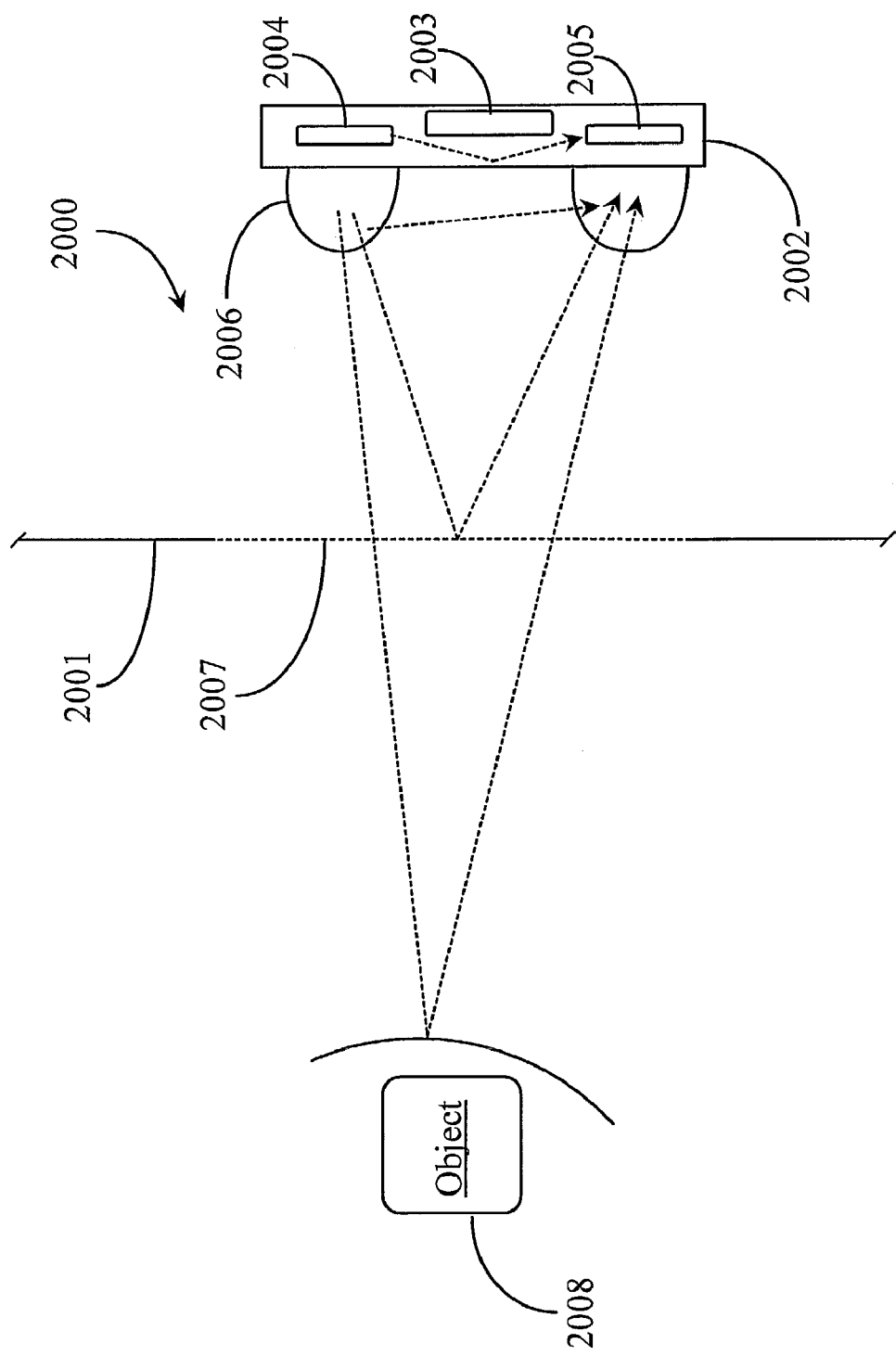
FIG. 20 is a block diagram illustrating a proximity sensor module configuration according to yet a further aspect of the present invention.

FIG. 20 is a block diagram illustrating a proximity sensor module configuration 2000 according to yet a further aspect of the present invention. The proximity sensor of the present invention can be easily packaged as a very small but robust sensor using state-of-art die mounting and molding techniques. The resulting proximity sensor module may take up a small enough form factor to be very practical in application and very inexpensive to manufacture in large quantities.

Sensor 2000 includes a photodiode 2005 having trace or pin connectivity to the proximity sensing circuitry implemented in this example in the form of an integrated circuit (IC) 2003. IC 2003 may contain some of or all of the circuit components described above in this specification. Module 2000 also includes at least one LED 2004 connected to IC 2003. The described components may be contained within a small molded polymer body or encapsulation 2002. In this example, a thin transparent bubble feature 2006 is formed to or otherwise affixed to body 2002 over LED 2004. A like feature is provided to cover photodiode 2005 in the same manner. In this example, optical isolation is not used.

Only a single optical window 2007 is required in the product case 2001 that covers the sensor module. The product maybe a cellular telephone, for example, and module 2000 may be a reflectance proximity sensor connected to the speakerphone function of the telephone. When the product is brought up toward a user's ear, the speakerphone function automatically turns off due to proximity detected. When the telephone is lowered away from the user proximity is no longer detected and the speakerphone automatically turns on. This is just one conceived application of many possible applications for a small inexpensive but robust proximity sensor.

In this inexpensive application, there is no need for optical isolation between the photodiode and the LED. In fact, LED 2004 has direct communication with photodiode 2005 through the internal cavity of the molded body 2002. LED 2004 also has indirect communication with photodiode 2005 through the transparent bubble feature 2006. There is also optical reflectance coming into photodiode 2005 from the optical window. The actual reflectance from object 2008 may cause just a slight increase in overall current at photodiode 2005, perhaps as low as 0.01%, of the total current. In this application, digital counters are used to register reflectance enabling the sensor to remember reflectance states more reliably than. For example using capacitance, which is subject to drift. Increases in current as low as 0.01% can be reliably detected as proximity over a period of one second or more. This is all that is required to provide high granular detection for on/off sensors.

In one embodiment, some optical isolation features may be implemented in module 2000 to enable a bit more resolution without causing manufacturing costs to rise significantly. One option is to provide a small optical barrier in-between the photodiode and the IC to isolate the photodiode, at least from internal communication from the LED.

It was described above that it is difficult with analog circuitry to store an accurate analog value reliably (e.g. a capacitor voltage) for more than tens of milliseconds before the value drifts. Therefore in a preferred embodiment, the analog pulse width is converted to a digital count signal with a resolution finer than any jitter present. In this way, the value is reliable and can be stored indefinitely in the digital domain. This is particularly useful in applications requiring long-term history. In applications using feedback immunity and/or noise peak detection, for example, averaging over many proximity measurement cycles can increase proximity sensitivity and immunity against fluorescent noise.

In one embodiment where a microprocessor is included in or is accessible to the module, the microprocessor may receive the pulse-width output and convert it into a digital signal. Such a processor may be programmed to emulate the on-off function described further above. This may be accomplished by setting a pulse-width threshold count that must be exceeded in order to detect proximity. It may be desirable to do this in order to have this threshold set by communication from a keyboard or by some other algorithm or criterion.

Figure 21:
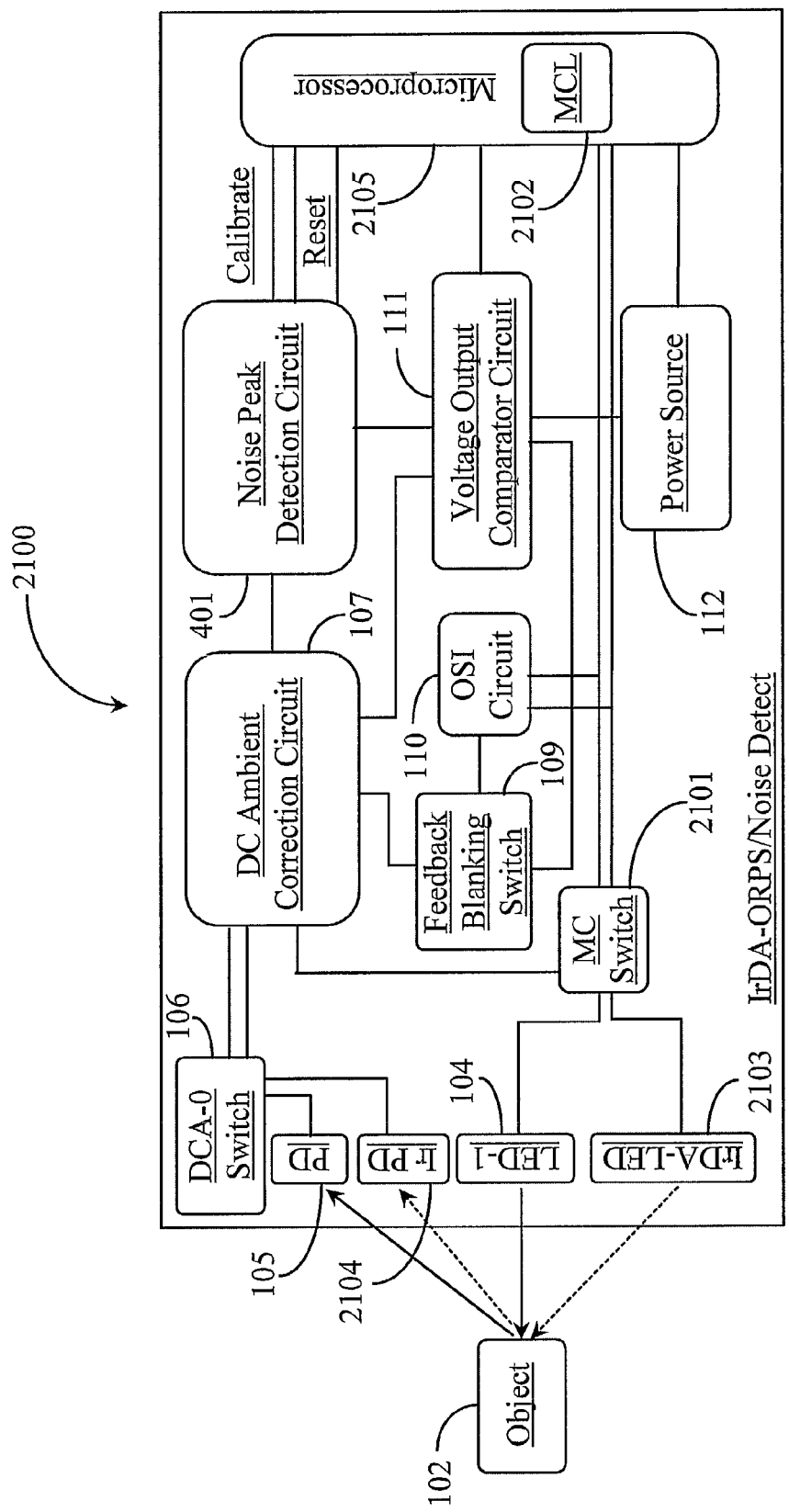
FIG. 21 is a block diagram illustrating components for a combination infrared and reflectance sensor 2100 according to an embodiment of the present invention.

FIG. 21 is a block diagram illustrating components for a combination infrared and reflectance sensor 2100 according to an embodiment of the present invention. Infrared (IrDA) transceivers, including one-way remote infrared receivers need to remove need to remove DC and low-frequency ambient background like reflectance sensors do. Therefore, the system of the present invention may be used to provide a low cost sensor that combines the capabilities of an infrared and a reflectance proximity sensor.

Duel mode sensor 2100 contains much of the components and circuitry already described above with reference to FIG. 1, FIG. 4, and FIG. 7. Therefore, components of this example that are also present in the above-described examples shall not be re-introduced and shall retain their same element numbers unless modified by the present embodiment.

Integrating a proximity reflectance sensor and an infrared sensor into a single dual-mode module is both practical and economical. Such integration may be accomplished by providing a minimal amount of mode-control circuitry and logic. By toggling between infrared and optical reflectance modes, both capabilities may be active in a single sensor. Accordingly each mode uses the same circuitry components in turn to increase sensitivity and reduce or eliminate noise and feedback.

Sensor 2100 has a microprocessor 2105 provided thereto that is adapted to control TX function like processor 108 described further above. In addition, processor 2105 contains programmable mode control logic (MCL) 2102 executable thereon for defining the parameters that govern mode toggling between infrared and reflectance mode of sensor 2100.

For infrared sensing mode, sensor 2100 includes an added infrared (IrDA) LED 2103 and driver (driver not shown) and a one-way infrared receiver photodiode (IrPD) 2104. A mode control switch (MC switch) 2101 is provided to facilitate mode toggling controlled, in this example, by the microprocessor with the aid of MCL 2102. In this example, microprocessor 2105 may be an on-board or an off-board processing component.

MC switch 2101 controls TX activate to either LED 104 for optical reflectance mode, or to IrDA-LED 2103 for infrared mode according to logic 2102. The exact rules defined by logic 2102 may vary widely according to application. An example of a rule might be to toggle between infrared and reflectance according to a time cycle such as between daytime and nighttime. Another rule might be to cycle between the 2 modes every one or two seconds.

MC switch 2101 has connection to DC ambient correction circuit (DCACC) 107. A connection is also added between DCACC 107 and DCA-0 switch 106 and from switch 106 to IrPD 2104. In this way, IrPD 2104 may be disabled from functioning during reflectance mode and the optical reflectance PD may be disabled during infrared mode. In one embodiment, no new traces or pins are required. In this embodiment, a switch may simply be provided in DCACC 107. It is noted herein that the traces connecting DCACC 107 to PD 105 and IrPD 2104 are logical only and do not represent actual circuitry connections. In actual practice, PD 105 and IrPD 2104 have direct and feedback current traces to the correction circuit.

In this example, a logical trace is added between VOCC 111 and DCACC 107 to enable bypass of the noise peak detection circuit 401 during infrared proximity calibration. NPDC 401 is optional and is not required to successfully practice the invention using the dual mode sensor. However, in one embodiment NPDC may be used to detect peaks after initial calibration in either or both embodiments without departing from the spirit and scope of the present invention. By combining a reflectance proximity sensor and an infrared receiver or transceiver in this fashion described in this example, costs can be reduced in applications that conceivable may utilize both functions.

For example, a one-way remote receiver or IrDA transceiver may be incorporated into a proximity-controlled electronic product to allow programming the proximity or other behavior of the product with either a one-way remote control or with a terminal product with an IrDA transceiver, such as a Personal Digital Assistant (PDA) or cellular telephone. For example, a smart proximity-controlled light switch could be programmed via an IrDA link for proximity sensitivity, turn-off delay, automatic time-of-day turn on, etc. by using the IrDA port of a PDA programmed appropriately to act as a user friendly remote terminal for setting these parameters.

One with skill in the art will appreciate the many possible sensor applications and embodiments made possible using the low-cost sensor of the present invention. In a sensor having two LEDs one on either side of a photodiode like the example described in FIG. 18, object directional motion may be determined. For example, in a robot motor toy a pulsed LED could be placed on each side of the photodiode in order to determine whether an object was to the left or the right of the photodiode. The closer and shorter the reflection path length to either LED, the higher the level of reflection. This provides a toy robot the information to steer away or towards an object. If used in a toy bear, the left-right information provided by two transmit LEDs might allow the bears head or eyes to track a nearby object. The use of two LEDs where their reflectance levels are compared overcomes ambiguities due to the absolute reflectivity of the object. In addition, if visible LEDs are used for reflectance or visible LEDs driven in parallel, may create an effect of illuminated eyes that respond to what is in front of them.

In another embodiment 4 or more LEDs may be positioned around a photodiode wherein the LEDs might be used to determine the location of a hand or digit along two or more axis in order to control a joystick or cursor controller. One key advantage of providing digitized proportional output as opposed to analog is that more useful attributes of the proximity reflection can be determined. For example, if the reflection is either increasing or decreasing, the system can determine that an object may be either approaching or moving away. This would be useful for an automobile backup sensor that creates an audible warning with increasing pitch only if an object is getting closer but does not produce a warning if moving away.

In still another application using multiple LEDs in a proximity sensor of the present invention, color attributes of an object may be determined. For example, by providing LEDs of varying colors, one may measure the reflectance ration for the LEDs to determine the color attributes of the object.

Yet another example of use of multiple LEDs and measuring proportional output is to replace touch buttons with proximity buttons. When the reflection over an LED exceeds a pre-determined level and is greater than the reflection from the other LEDs, the touch less system assumes this is LED control that a user desires to activate. A light pipe may gather light from the vicinity of each LED to send to a common receiver. In addition, an audible or visible feedback signal for each sensing LED can let a user know if the finger is coming closer than necessary. If a visible LED is used for reflectance, this same LED can be independently flashed at a different duty cycle, pulse width, etc. to confirm to the user that the reflectance system senses the user's finger over the LED. Activation may occur if the reflectance increases by a certain amount after the system confirms by flashing the LED. Such a system could allow surgeons in a sterile operating field to activate instrument controls without direct touch.

In another embodiment, an IrDA proximity sensor with optical ambient immunity circuitry according to the present invention may be provided to function as a controller for the power mode of an infrared wireless input device such as a computer mouse. An infrared computer mouse has three basic modes, idle, active, and sleep mode. Integrating a proximity sensor of the present invention with mouse can save significant power consumption by reducing or completely eliminating the idle time. The proximity sensor is placed in position to power-up the optical sensor's micro controller RF section when a human hand is within a specified proximity range.

Figure 22:
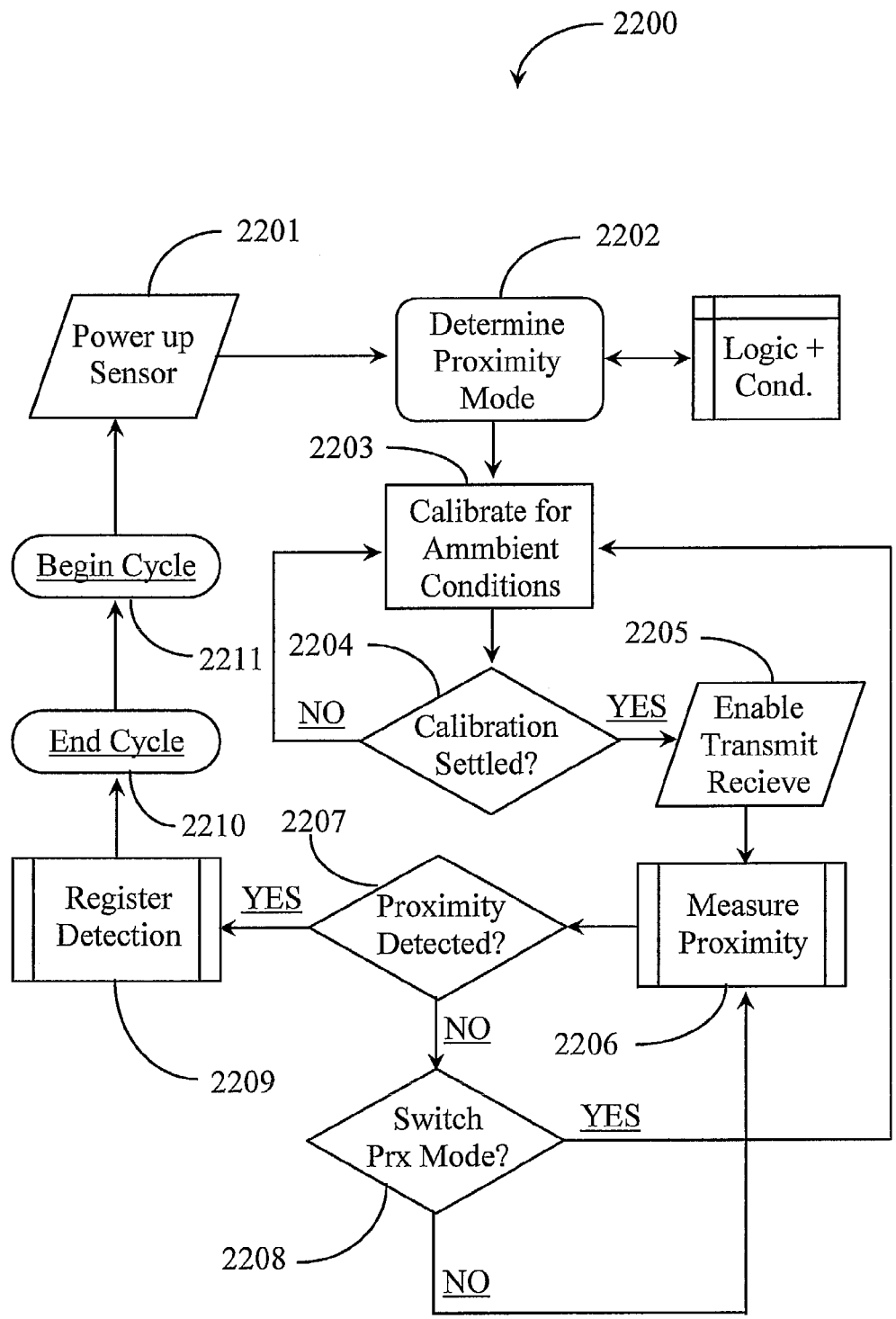
FIG. 22 is a process flow chart illustrating steps for using the sensor of FIG. 21 according to an embodiment of the present invention.

Using proximity detection as power controller the dwell time in idle and sleep modes of the mouse can be reduced to microseconds. Eliminating idle mode enables the mouse to cycle between active mode and sleep mode. The idle current consumption of a proximity sensor enhanced with the circuitry of the invention can be set to as low as 6 uA. Feedback immunity and noise peak detection components provide a high immunity from ambient optical signal and fluorescent light sources. It will be apparent to the skilled artisan that power saving components such as the wake up logic coupled with high sensitivity due to ambient calibration and peak detection components enable a very small footprint and low power consumption for a robust sensor that can be integrated into many types of electronic devices as power-controlling proximity based circuits FIG. 22 is a process flow chart illustrating steps 2200 for using sensor 2100 of FIG. 21 according to an embodiment of the present invention. Process steps 2200 embody a process for using a dual-mode sensor analogous to sensor 2100. It is assumed in this example that a sleep cycle is observed in order to save power. However, a sleep cycle is optional and not specifically required to successfully use sensor 2100.

At step 2201, the sensor is powered up. Step 2201 may be an initial power-up, or a power-up after a specified sleep period has expired. At step 2202, the sensor determines proximity mode. Proximity mode can be reflectance or infrared. Determining which mode to begin with may include accepting mode assignment made by a microprocessor according to logic and proximity conditions. In one embodiment the sensor begins in whatever mode is opposite from the mode it ended on. To give an example, if at daytime, a sensor is to function as a reflectance sensor and at nighttime the same sensor is to function as an infrared sensor the conditions at power up will determine which mode the sensor begins operating in.

Regardless of the current active mode, at step 2203, a calibration period begins to calibrate the sensor for ambient conditions. At step 2204, it is determined if the calibration loop has settled. If at step 2204, the calibration loop has not yet settled, the process loops back to step 2203. If at step 2204, the calibration loop has settled, then at step 2205 the system enables transmit and receive according to mode assignment or determination at step 2202. A mode control switch enables disablement of one mode while the other mode is active.

At step 2206, proximity is measured. At step 2207, the system determines if proximity has been detected. Steps 2206 and 2207 may repeat many times during a period. If proximity is detected at step 2207 then the proximity event is registered at step 2209. After detection of proximity, the cycle may end and the sensor may go into a sleep cycle. After the sleep period, the process may resume at step 2211 where a new cycle begins. The process continues at step 2201 for a new cycle.

If proximity is not detected in step 2207, the system may determine whether to switch modes at step 2208. It the system does not switch modes, then the process may loop back to step 2206. If the system determines to switch modes at step 2208 then the process may loop back to step 2203 for calibration for DC ambient conditions with respect to the fresh mode.

One with skill in the art will appreciate that the system may be toggle between proximity modes according to any specific logic relative to toggle rules. For example, it may be that the system switches back and forth between reflectance mode and infrared mode very rapidly by default causing the process to continually loop back from step 2208 to step 2203 at each mode switch until a proximity event is detected. In another embodiment, the sensor operates in a specific mode at a specific pre-programmed time period such as optical reflectance by day and infrared proximity by night.

In one embodiment, the sensor may always be on with no sleep cycle eliminating steps 2210, 2211, and 2201 from the process. In still another embodiment, a sleep cycle is not dependant on registration of a proximity event. A sleep cycle may be inserted into the process after step 2207 and before step 2208 just to save some power. In one embodiment, step 2208 is optional and not required as part of process 2200.

If a dual-mode sensor is adapted to take both reflectance and infrared information during a same general time period, then toggling from one mode to the other during operation may be performed automatically according to a specific timing such as "switch modes every 0.75 seconds".

In still a further embodiment, a smart shutout mechanism may be put into place to override the toggling function if on average over time the sensor is performing at better sensitivity levels during one or the other proximity mode. Such a mechanism might be provided in the form of software or firmware on the microprocessor that, during operation, records sensitivity parameters and conditions averaging them over subsequent samplings. When one mode is performing better than the other the microprocessor may issue a command to "hold" whatever mode is doing better. A useful embodiment might be one where some ambient conditions change rapidly for the worst causing the reflectance mode, for example, to lose the ability to resolve the problem sufficiently and wherein the same conditions have no affect on the infrared mode. In this way the sensor can default to a calibrated and working mode until the problem can be identified and fixed.

Figure 23:
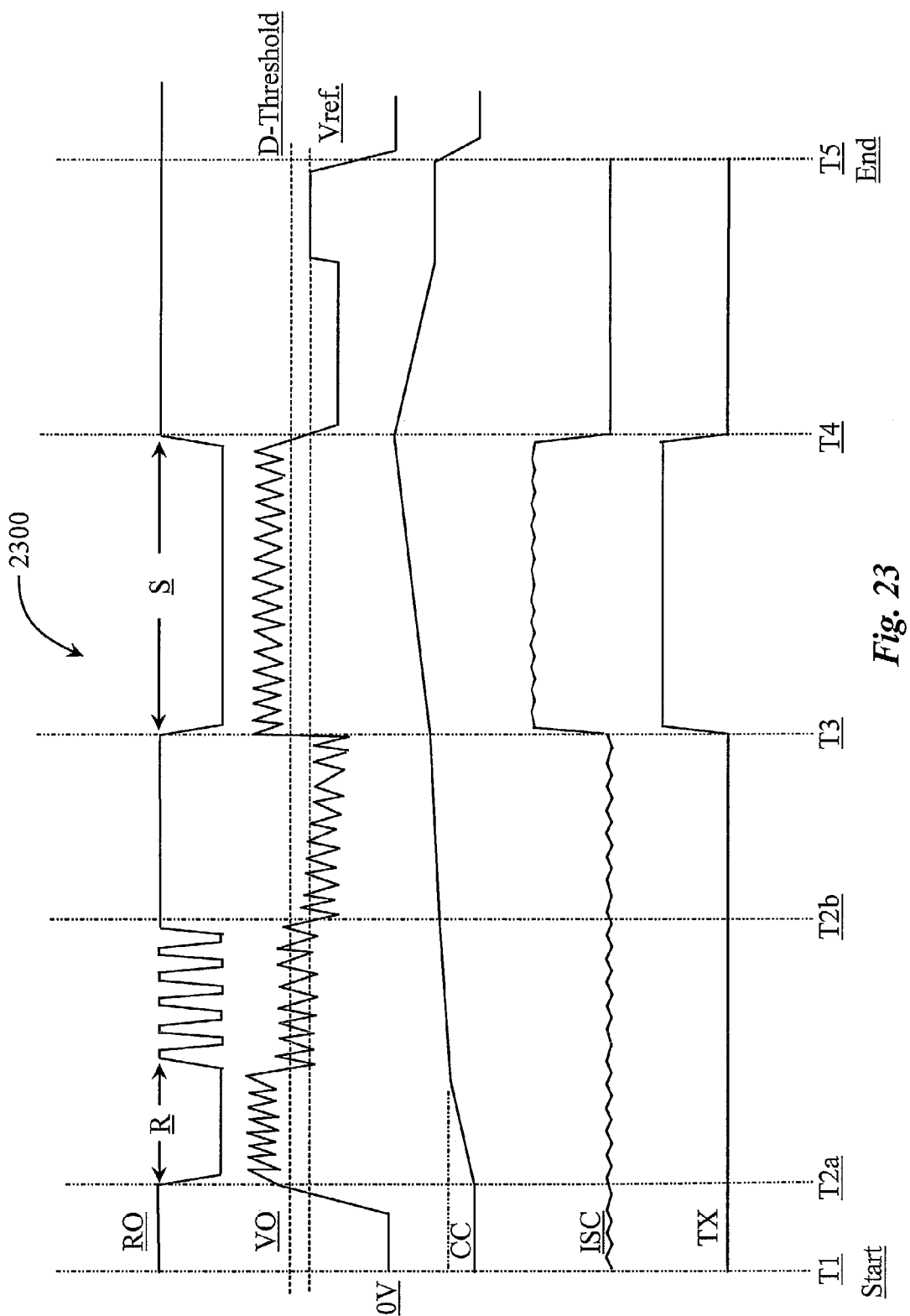
FIG. 23 is a timing chart illustrating a second stage of calibration in an embodiment of the invention.

FIG. 23 is a timing chart 2300 illustrating the introduction of a second stage of calibration for noise peaks above DC ambient according to an embodiment of the present invention. Timing chart 2300 illustrates several waveforms as they might appear at different portions of sensor 400 of FIG. 4 during specific timing segments illustrated herein as those defined by times T1, which is a start time through T5, which is an end time.

Referring now to the top most waveform, RO (output from VOCC) is flat or unchanged until calibration for DC ambient begins at time T2a. At time T2a, the LED TX is off. Pulse width R measured in output of the comparator is proportional to the DC ambient signal. By time T2b, the DC ambient signal has been corrected for DC ambient light and the loop has settled At time T2b, a second calibration period begins for the correction of noise peaks caused by florescent noise or some other similar noise source. Between time T2b and time T3, DC ambient calibration continues in addition to noise peak detection. The noise peak detection circuit is activated at time T2b. At time T3, LED TX begins for measuring proximity. A reflectance signal having a pulse width of S is illustrated as measured in RO between time T3 and time T4. At time T4, the LED TX is powered off. RO then returns to its normal value.

Referring now to the next waveform, VO (VOCC input) is illustrated. The input into VOCC is 0V at T1. At power up (T1), the VO rises until calibration for ambient begins at T2a. The waveform immediately below VO is the DC ambient correction current (CC). As DC ambient noise occurs between T2a and T2b, the CC ramps up to force the DC ambient signal below a detect threshold value illustrated in the chart as a broken line labeled D-Threshold. Between time T2b and T3, the noise peak detection circuit feeds a capacitor which is used to force the DC ambient offset down below D-threshold at or below the reference voltage (Vref) Vref is illustrated herein as a second broken line beneath D-threshold and labeled Vref.

The ramp up of the correction current is proportional to the signal being corrected. In this example there is normal DC ambient from soft light or incandescent light and noise caused by florescent lighting for example. In the first calibration stage, the normal DC ambient is corrected. In the second calibration stage for florescent light, the noise peaks from the florescent source are forced below the detect threshold and or below their reference voltage at VOCC. At T3 the TX LED switches on and reflectance is detected between T3 and T4 that is above the detect threshold level insuring that it is indeed from a detected object and not from DC ambient noise or other noise like florescent noise.

At time T4, the LED TX is switched off and the signal overcorrects below Vref and at time T5 the cycle ends and the sensor is idle or in sleep mode. At time T3, the correction current ramps up even higher to correct or cancel the reflectance signal illustrated in VO between time T3 and T4. The correction current begins dropping after T4 (LED TX off) and the circuit settles before idle or sleep mode when it goes back to zero.

For reference, the next two waveforms are the input signal current out of the photodiode before amplification, and the TX current. Activity between T3 and T4 illustrated TX on. The input signal shows TX on and noise and reflectance are present in the signal.

It will be apparent to one with skill in the art that the sensor of the invention may be provided using some or all of the mentioned features and components without departing from the spirit and scope of the present invention. It will also be apparent to the skilled artisan that the embodiments described above are exemplary of inventions that may have far greater scope than any of the singular descriptions. There may be many alterations made in the descriptions without departing from the spirit and scope of the present invention.

What is claimed is:

1. A proximity sensor comprising:
one or more wavelength transmitting light-emitting diodes;
one or more wavelength receiving photodiodes;
a photocurrent receiver connected to the photodiode and consisting of a transimpedance amplifier;
an ambient correction circuit for calibrating DC ambient in a signal generated at the receiving photodiode(s) immediately prior to a reflectance measurement, the circuit constructed as a gyrator from a transconductance amplifier, a capacitor which stores the voltage analog of the DC correction current, and a voltage to current circuit, MOS transistor, for producing the correction current ambient signal at a known rate, the period above a fixed receive-detect threshold required to cancel the DC ambient used to produce a pulse width proportional to the DC ambient signal, the same gyrator circuit used during a subsequent proximity cycle to convert an increase in input signal due to reflection above a fixed receive detect threshold into a pulse width proportional to the reflectance signal;
a pulse width comparator circuit for comparing a pulse width signal proportional to the reflected signal against a preset pulse width value to detect proximity;
a transmitter connected to light-emitting diode(s), which emit light pulses that are reflected by an object in proximity and received at the photodiode; and
a controller system that controls the these elements by continuously alternating a DC calibration cycle with a proximity measurement cycle or on demand first performs the DC calibration cycle followed by the proximity measurement cycle.

2. The proximity sensor of claim 1 further comprising a feedback blanking switch, which disconnects the signal path between the comparator and the transimpedance amplifier on the leading edge of a transmit signal for a small portion of the transmit pulse duration.

3. The sensor of claim 1, wherein at least one of the one or more transmitting diodes is a visible-light emitting diode and at least one of the one or more receiving diodes is a visible photodiode.

4. The sensor of claim 1, wherein at least one of the one or more transmitting diodes is an infrared light emitting diode and at least one or more of the receiving diodes is an infrared receiver.

5. The sensor of claim 1 further comprising:
a noise peak detector of the received signal, which provides dynamic adjustment of the receive detect threshold to a peak value above transient ambient spikes to reduce spurious detection.

6. The sensor of claim 5, wherein at least one of the one or more transmitting diodes is a visible-light or infrared emitting diode and at least one of the one or more receiving diodes is a visible-light or infrared photodiode.

7. The sensor of claim 1 further comprising:
an adjustable delay clock; and
a data latching circuit;
characterized in that a clock signal is input into the data latching circuit to latch the output of the comparator circuit, the delay clock advanced or retarded to adjust proximity detection sensitivity.

8. The sensor of claim 7, wherein at least one of the one or more transmitting diodes is a visible-light or infrared emitting diode and at least one of the one or more receiving diodes is a visible-light or infrared photodiode.

9. The sensor of one of claims 1, 5, or 7, wherein the output pulse width of the comparator circuit is proportional to the DC ambient background signal level.

10. The sensor of one of claims 1, 5, or 7, wherein the output pulse width of the comparator is converted to a digital value by a counter driven by a frequency source.

11. The sensor of one of claims 1, 5, or 7, wherein there are more than one transmitting diode, and a single receiving diode, the transmitting diodes geometrically arraigned about the receiving diode at different distances from the receiving diode.

12. The sensor of claim 11, wherein the transmitting diodes reflectance contribution levels are compared to determine proximity according to a mathematical formula.

13. The sensor of claim 12 wherein comparison of each transmitting diodes reflectance contribution determines direction of motion of an object moving in the sensor field.

14. A method for calibrating a proximity sensor and then measuring proximity in a repeating cycle or on demand, the sensor including one or more wavelength transmitting diodes, one or more wavelength receiving diodes, an ambient correction circuit, and a comparator circuit comprising the steps of:
  (a) powering on the sensor;
  (b) canceling the ambient signal during a calibration period by slewing the correction current at a fixed rate by charging a capacitor at a fixed rate until the receive comparator falls below detection. The voltage on the capacitor determines the correction current. The pulse width of the period required for the correction to completely cancel the input DC ambient represents the DC ambient level;
  (c) in the proximity measurement cycle, using the method in (b) to convert the increase in reflection signal above the DC ambient into a reflectance pulse width;
  (d) transmitting wavelengths to and receiving reflectance from an object in the path of the transmitted wavelengths;
  (e) measuring a reflectance pulse width and comparing the width value to a preset width value to determine proximity; and
  (f) powering down the sensor to a standby mode.

15. The method of claim 14, wherein in step (a), power up is performed in response to an internal or external event.

16. The method of one of claims 14 or 15, wherein the sensor further includes a peak detector for establishing a peak value above transient ambient noise spikes and correspondingly adjusts the receive detection threshold value of the comparator to above the value of the noise spikes.

17. The method of one of claims 14 or 15, wherein the sensor further includes an adjustable delay clock, and a data latching circuit for storing a sampled proximity measurement between cycles.

18. The method of one of claims 14 or 15, wherein there are more than one transmitting diode and in step (c), each of the transmitting diodes is caused to transmit separately from the other diodes.

19. The method of one of claims 14 or 15, wherein in step (d), the proximity determination controls an on/off switch.

20. The method of one of claims 14 or 15, wherein in step (d), the proximity determination is analyzed to provide additional information about direction and or speed of movement of an object sensed.

21. The sensor of claim 1 integrated in a form of a monolithic integrated circuit combining proximity detection function and optical communication function including but not limited to IrDA and consumer remote control.

22. The sensor of claim 21 where the same gyrator circuit used in the optical communication function to remove DC ambient from the high gain receiver is re-configured to provide the gyrator to produce pulse widths for DC ambient measurement and proximity measurement, wherein the same optical photodiode, high gain receiver, bias and interface circuits are reconfigured for use in DC ambient and proximity mode, and optionally the same transmitter and LED are also used for proximity mode, not DC ambient measurement.

23. The sensor of claim 21, which uses optical communication mode to program or control it's DC ambient or proximity mode and other operating parameters; such as sensitivity, proximity sample rate, etc.

* * * * *

UNITED STATES PATENT AND TRADEMARK OFFICE
CERTIFICATE OF CORRECTION

PATENT NO. : 7,486,386 B1
APPLICATION NO. : 11/859403
DATED : February 3, 2009
INVENTOR(S) : Holcombe et al.

Page 1 of 1

It is certified that error appears in the above-identified patent and that said Letters Patent is hereby corrected as shown below:

Title page, item [73]
In the Assignee delete "Silison Laboratories Inc.," and insert --Silicon Laboratories Inc.--

In claim 1, column 28, line 35, insert --all of which together reduces the DC-- after "correction current,"

In claim 14, column 29, line 47, please delete "detection. The" and insert --detection wherein the--

In claim 14, column 29, line 48, please delete "current. The" and insert --current and the--

Signed and Sealed this

Thirty-first Day of March, 2009

JOHN DOLL
*Acting Director of the United States Patent and Trademark Office*